(12) United States Patent
Tanoue

(10) Patent No.: US 8,048,722 B2
(45) Date of Patent: Nov. 1, 2011

(54) MANUFACTURING METHOD OF SEMICONDUCTOR DEVICE

(75) Inventor: Tetsuharu Tanoue, Tokyo (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 13/021,284

(22) Filed: Feb. 4, 2011

(65) Prior Publication Data

US 2011/0124159 A1 May 26, 2011

Related U.S. Application Data

(63) Continuation of application No. 12/545,964, filed on Aug. 24, 2009, now Pat. No. 7,915,086, which is a continuation of application No. 11/759,290, filed on Jun. 7, 2007, now Pat. No. 7,659,146.

(30) Foreign Application Priority Data

Jun. 14, 2006 (JP) ................................. 2006-164822

(51) Int. Cl.
*H01L 21/50* (2006.01)
(52) U.S. Cl. ........ 438/126; 438/107; 438/123; 438/124; 438/E31.065
(58) Field of Classification Search .......... 438/106–118, 438/611–617; 257/690–693
See application file for complete search history.

(56) References Cited

U.S. PATENT DOCUMENTS

| 7,408,252 | B2 | 8/2008 | Shimanuki |
| 7,531,441 | B2 * | 5/2009 | Kado et al. ................. 438/612 |
| 2004/0026767 | A1 | 2/2004 | Sato et al. |
| 2006/0017151 | A1 | 1/2006 | Yoon et al. |

FOREIGN PATENT DOCUMENTS

| JP | 2002-050715 | 2/2002 |
| JP | 2005-079129 | 3/2005 |

* cited by examiner

*Primary Examiner* — Dung A. Le
(74) *Attorney, Agent, or Firm* — Antonelli, Terry, Stout & Kraus, LLP.

(57) ABSTRACT

Performing electrolysis plating to a wiring is made possible, aiming at the increasing of pin count of a semiconductor device. Package substrate 3 by which ring shape common wiring 3p for electric supply was formed in the inner area of bonding lead 3j in device region 3v of main surface 3a is used. Since a plurality of first plating lines 3r and fourth plating lines 3u for electric supply connected to common wiring 3p can be arranged by this, the feeder for electrolysis plating can be arranged to all the land parts on the back. Hereby, it becomes possible to perform electrolysis plating to the wiring of main surface 3a of package substrate 3, and the back surface. Even if the land part of plural lines is formed covering the perimeter of the back surface, electrolysis plating can be performed to the all land parts. As a result, electrolysis plating can be performed to a wiring, aiming at the increasing of pin count of a semiconductor device.

6 Claims, 19 Drawing Sheets

MANUFACTURING METHOD OF SEMICONDUCTOR DEVICE

CROSS-REFERENCE TO RELATED APPLICATION

This application is a Continuation application of application Ser. No. 12/545,964, filed Aug. 24, 2009, now U.S. Pat. No. 7,915,086 which is a Continuation application of application Ser. No. 11/759,290, filed Jun. 7, 2007, now U.S. Pat. No. 7,659,146 the contents of which are incorporated herein by reference in their entirety. The present application claims priority from Japanese patent application No. 2006-164822 filed on Jun. 14, 2006, the content of which is hereby incorporated by reference into this application.

FIELD OF THE INVENTION

The present invention relates to manufacturing technology of a semiconductor device, and particularly relates to an effective technology in the application to manufacture of the semiconductor device using the wiring substrate in which the feeder was formed.

DESCRIPTION OF THE BACKGROUND ART

There is technology in which the first lead-out wiring for short-circuiting the plurality of the second conductor wiring pattern, and the connector line for making it connect without short-circuiting this on the way are formed in a product section, and which has a cutout where a connector line is deleted after an electrolysis plating covering is given to the second conductor wiring pattern via the first conductor wiring pattern, and between a plurality of second conductor wiring patterns is disconnected (for example, refer to Patent Reference 1).

Moreover, there is technology of supplying electric power from the common line for plating which was formed inside the inside via hole group in the other side of a substrate, and which was connected with each via hole of the inside via hole group with the conductor pattern, and the bus line for plating which was formed outside the outside via hole group in the other side of a substrate, and performing electrolysis plating while connecting the bus line for plating formed outside the outside via hole group at the one side side of a substrate, and each via hole of an outside via hole group with a conductor pattern (for example, refer to Patent Reference 2).

[Patent Reference 1] Japanese Unexamined Patent Publication No. 2005-79129 (FIG. 1)

[Patent Reference 2] Japanese Unexamined Patent Publication No. 2002-50715 (FIG. 1)

SUMMARY OF THE INVENTION

In semiconductor devices, such as BGA (Ball Grid Array) by which the semiconductor chip was mounted on the wiring substrate, it is in the tendency for the number of bonding electrodes to increase, with the advanced features. Since the miniaturization of a semiconductor device is also required simultaneously recent years, if a plurality of bonding electrodes formed in the main surface of the wiring substrate are not arranged to plural lines, it is difficult to reduce wiring substrate size.

Here, plating formation is carried out to the wiring on a wiring substrate in the manufacturing stage of a substrate. This plating forming step forms a plating film on the front surface of a bonding electrode in order to improve the bonding strength of the wire and bonding electrode in a later wire-bonding step. Also in a land part, the plating film for improving bonding strength with a solder ball is also formed. Plating consists of each film of nickel and gold, for example. As the method of plating formation, the electrolysis plating method and the electroless plating method are mainly known. The side of the plating film formed by the electrolysis plating method has the high bonding strength to wire bonding as compared with an electroless plating method. Furthermore, the side of the electrolysis plating method has a merit, like it is easy to control the thickness of plating.

Therefore, although it is preferred to adopt the electrolysis plating method, in adopting the electrolysis plating method, it is necessary to form the feeder for plating in a wiring substrate.

However, in BGA by which the miniaturization and the increasing of pin count were aimed at, as described above, bonding electrodes are arranged covering plural lines at the main surface side of a wiring substrate. Therefore, along the periphery of a wiring substrate, a plurality of bonding electrode and a plurality of through hole parts connected with a plurality of bonding electrodes via a plurality of lead-out wiring for electric supply are arranged crowding. Therefore, it is difficult to make the feeder for supplying electricity to a plurality of bonding electrodes arranged at the inner circumference (inside) extend and exist to the end portion (each side) of a wiring substrate. On the other hand, also in the back surface side of a wiring substrate, a plurality of land parts on which a solder ball is formed are arranged in a lattice manner in connection with a miniaturization and increasing of pin count of a semiconductor device, and the narrowing of a pitch (for example, pitch 0.4 mm) also of the pitch between adjacent land parts is done. Therefore, it is in a difficult state to let a feeder pass between the adjacent land parts. That is, the problem that it is difficult in the back surface side of a wiring substrate to arrange the feeder for electrolysis plating extending and existing to the end portion of a substrate to all the land parts (land part arranged especially at the center side of a wiring substrate) occurs.

The plating formation by the electrolysis plating method is disclosed by the Patent Reference 1 (Japanese Unexamined Patent Publication No. 2005-79129) and the Patent Reference 2 (Japanese Unexamined Patent Publication No. 2002-50715). Both are communizing the lead-out wiring for electrolysis plating in the inside part (central part) of the back surface of a substrate.

With this structure, when a semiconductor device is multi pin, for example, when the land parts are formed covering all of the perimeter in the back surface of the substrate by five rows, since there is no space, from the land part after the 2nd row from the inside, lead-out wiring for electric supply cannot be arranged towards the inside (central part), and communalization of the lead-out wiring for electrolysis plating in the central part cannot be aimed at. Similarly, since the land parts are formed covering all of the perimeter by five rows in the back surface of a substrate, lead-out wiring for electrolysis plating cannot be pulled out towards a substrate outside from the common wiring of the central part, either (there is only a space which can let the feeder connected with the land part arranged at the 2nd row from the outermost periphery row pass between the adjacent land parts arranged at the outermost periphery row). When common wiring is formed in the back surface of the substrate, after etching will separate common wiring after resist (solder resist) coating, it will be in the state where the end portion of common wiring was exposed from resist, and the problem of moisture absorption, the electric short problem by conductive-foreign-matter adhesion, etc. will occur.

A purpose of the present invention is to offer the technology which can make it possible to perform electrolysis plating to a wiring aiming at the increasing of pin count of a semiconductor device.

Another purpose of the present invention is to offer the technology which can make it possible to perform electrolysis plating to a wiring aiming at the miniaturization of a semiconductor device.

The above-described and the other purposes and novel features of the present invention will become apparent from the description herein and accompanying drawings.

Of the inventions disclosed in the present application, typical ones will next be summarized briefly.

That is, the present invention includes the step of preparing a wiring substrate formed by separating a common wiring and a lead-out wiring for electric supply after supplying electric power via the lead-out wiring for electric supply and forming plating in each wiring and electrode in a device region of the wiring substrate having a plurality of bonding electrodes formed in a main surface, the common wiring for electric supply formed in an inner area of the bonding electrode of the main surface, and a plurality of lead-out wirings for electric supply electrically connected with the common wiring. Further, the present invention includes the steps of mounting a semiconductor chip over the main surface of the wiring substrate, electrically coupling an electrode of the semiconductor chip, and the bonding electrode of the wiring substrate, and forming an external terminal in the land part of the back surface of the wiring substrate.

Advantages achieved by some of the most typical aspects of the invention disclosed in the present application will be briefly described below.

By using the wiring substrate by which the common wiring for electric supply was formed in the inner area of the bonding electrode in the device region of a main surface, a plurality of lead-out wiring for electric supply connected to the common wiring can be arranged, and the feeder for electrolysis plating can be arranged to all the land parts. As a result, even if the land parts of plural lines are formed covering the perimeter of the back surface of the wiring substrate, electrolysis plating can be performed to all the land parts, and electrolysis plating can be performed to a wiring, aiming at the increasing of pin count of a semiconductor device.

DETAILED DESCRIPTION OF THE PREFERRED EMBODIMENTS

Figure 1:
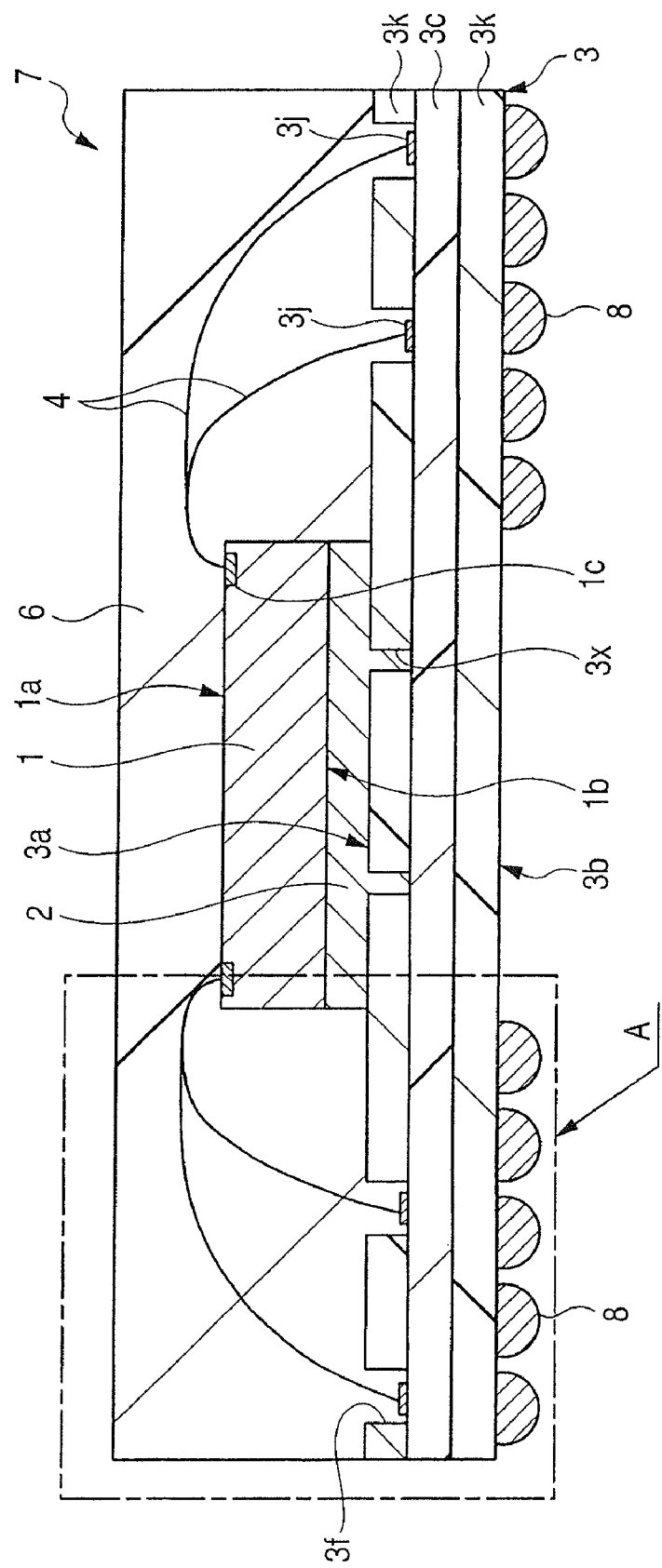
FIG. 1 is a cross-sectional view showing an example of the structure of the semiconductor device of the embodiment of the present invention.

In the following embodiments, except the time when especially required, explanation of identical or similar part is not repeated in principle.

Further, in the below-described embodiments, a description will be made after divided into plural sections or in plural embodiments if necessary for convenience sake. These plural sections or embodiments are not independent each other, but in relation such that one is a modification example, details or complementary description of a part or whole of the other one unless otherwise specifically indicated.

And, in the below-described embodiments, when a reference is made to the number of elements (including the number, value, amount and range), the number is not limited to a specific number but may be equal to or greater than or less than the specific number, unless otherwise specifically indicated or principally apparent that the number is limited to the specific number.

Hereafter, embodiments of the invention are explained in detail based on drawings. In all the drawings for describing the embodiments, members of a like function will be identified by like reference numerals and overlapping descriptions will be omitted.

Embodiment

Figure 2:
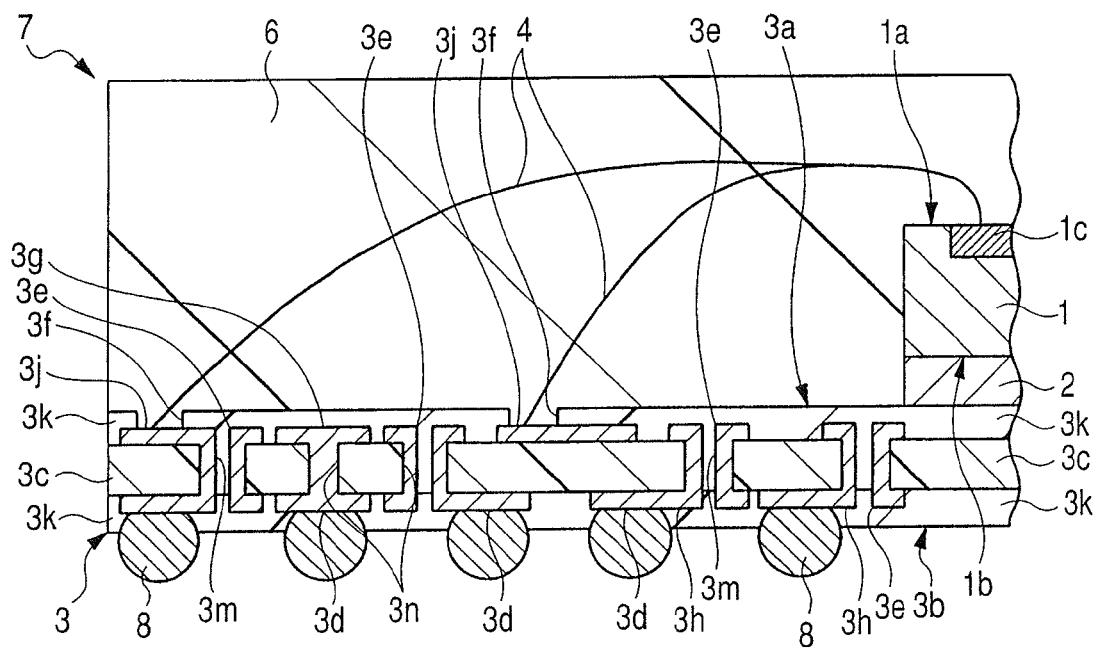
FIG. 2 is an enlarged partial sectional view showing the structure of the section A shown in FIG. 1.
Figure 3:
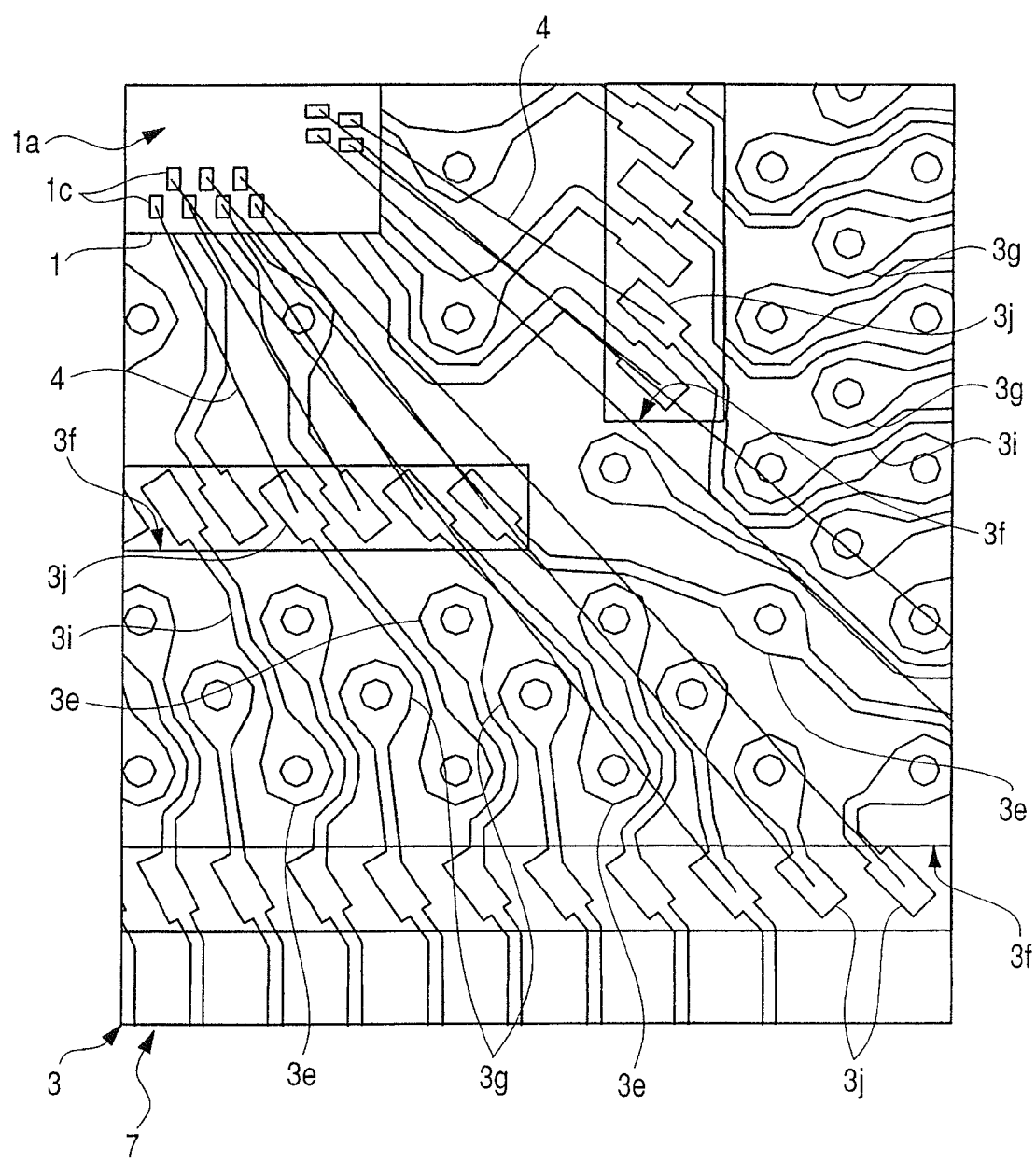
FIG. 3 is an enlarged partial plan view showing an example of the internal structure of the semiconductor device shown in FIG. 1 penetrating a resin body.
Figure 4:
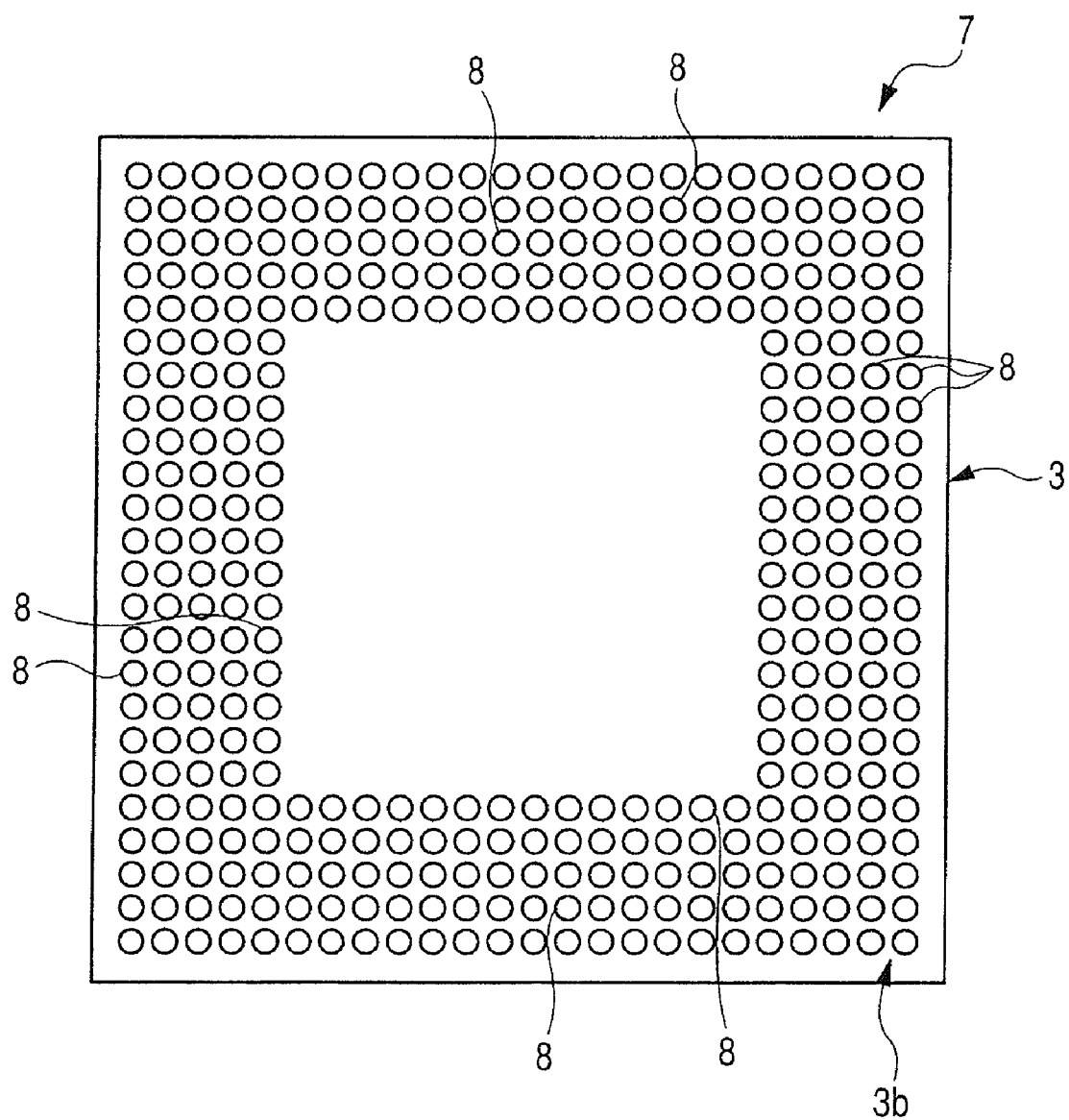
FIG. 4 is a back view showing an example of the structure of the semiconductor device shown in FIG. 1.
Figure 5:
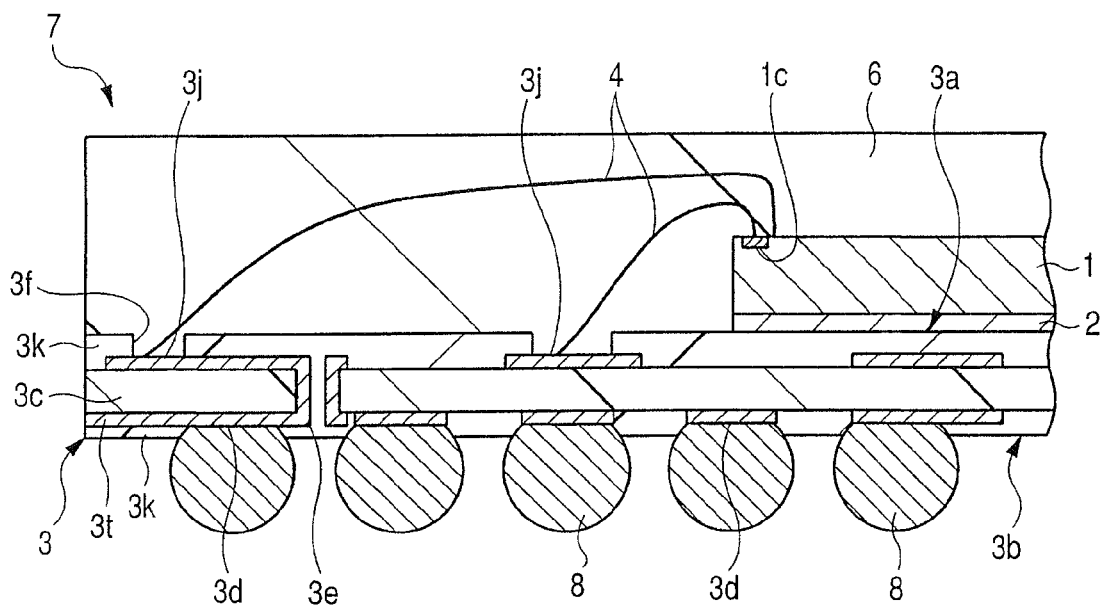
FIG. 5 is an enlarged partial sectional view showing an example of the feeder connected to the land part of an outermost periphery of the semiconductor device shown in FIG. 1.
Figure 6:
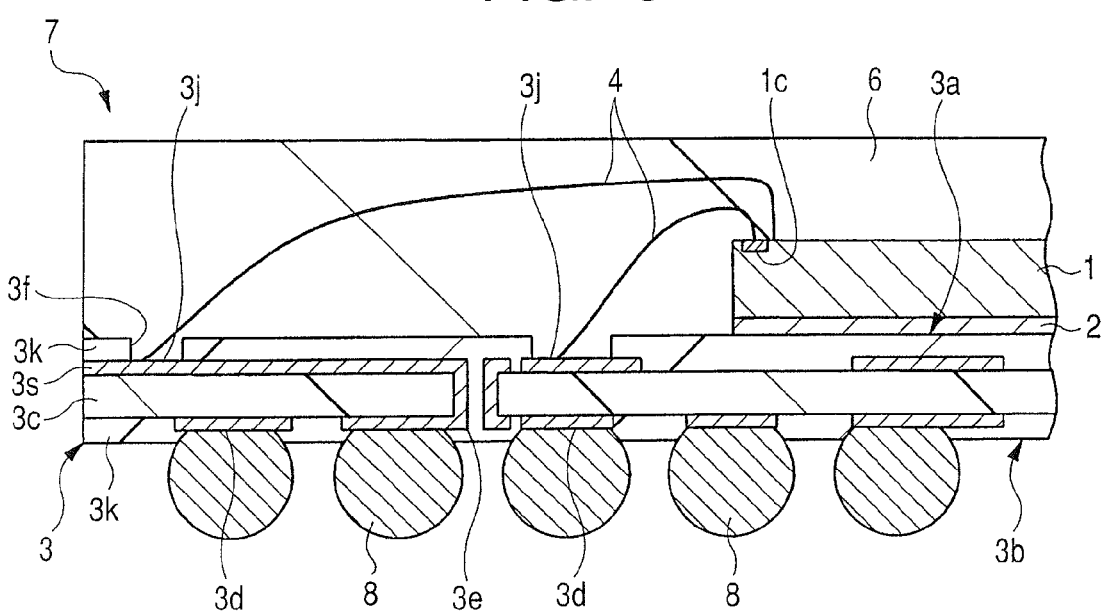
FIG. 6 is an enlarged partial sectional view showing an example of the feeder connected to the land part of the 2nd row from the outside of the semiconductor device shown in FIG. 1.
Figure 7:
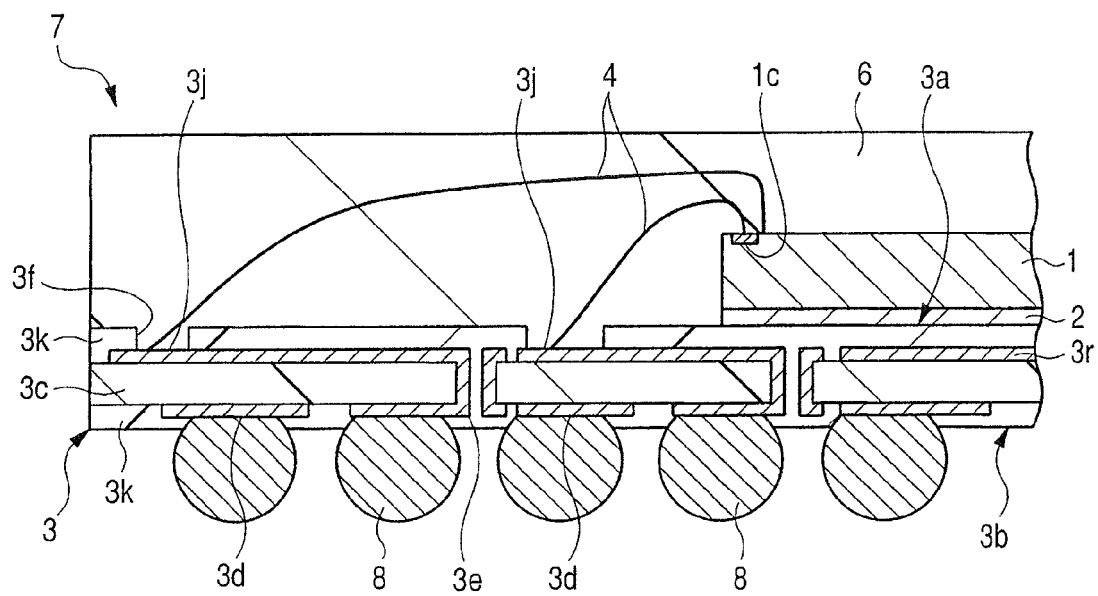
FIG. 7 is an enlarged partial sectional view showing an example of the wiring connected to the land part of the 3rd row and the 4th row from the outside of the semiconductor device shown in FIG. 1.
Figure 8:
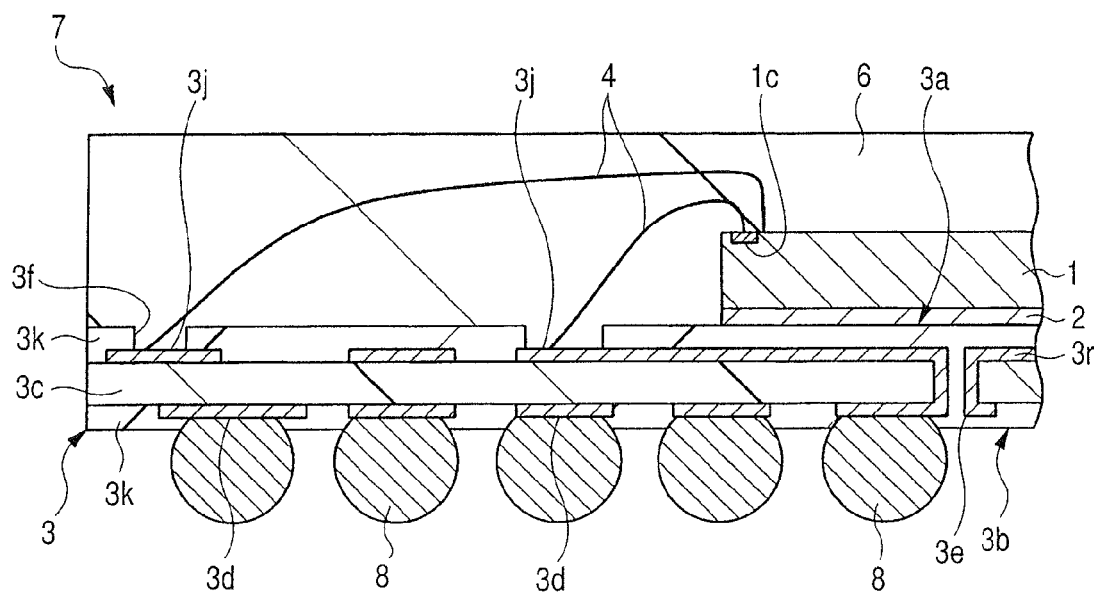
FIG. 8 is an enlarged partial sectional view showing an example of the feeder connected to the land part of an innermost circumference of the semiconductor device shown in FIG. 1.
Figure 10:
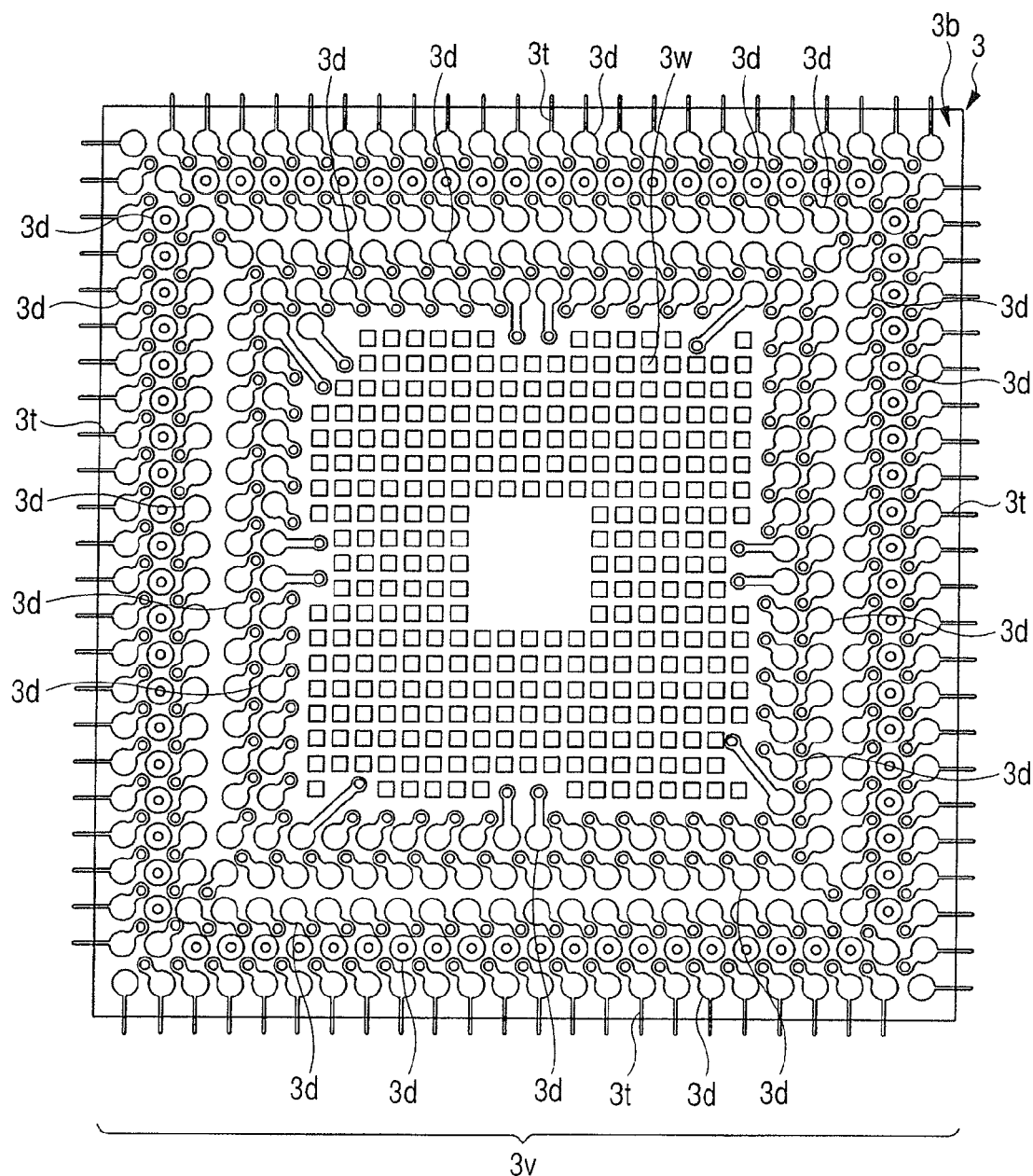
FIG. 10 is a plan view showing an example of the wiring pattern of the back surface of the wiring substrate shown in FIG. 9.
Figure 11:
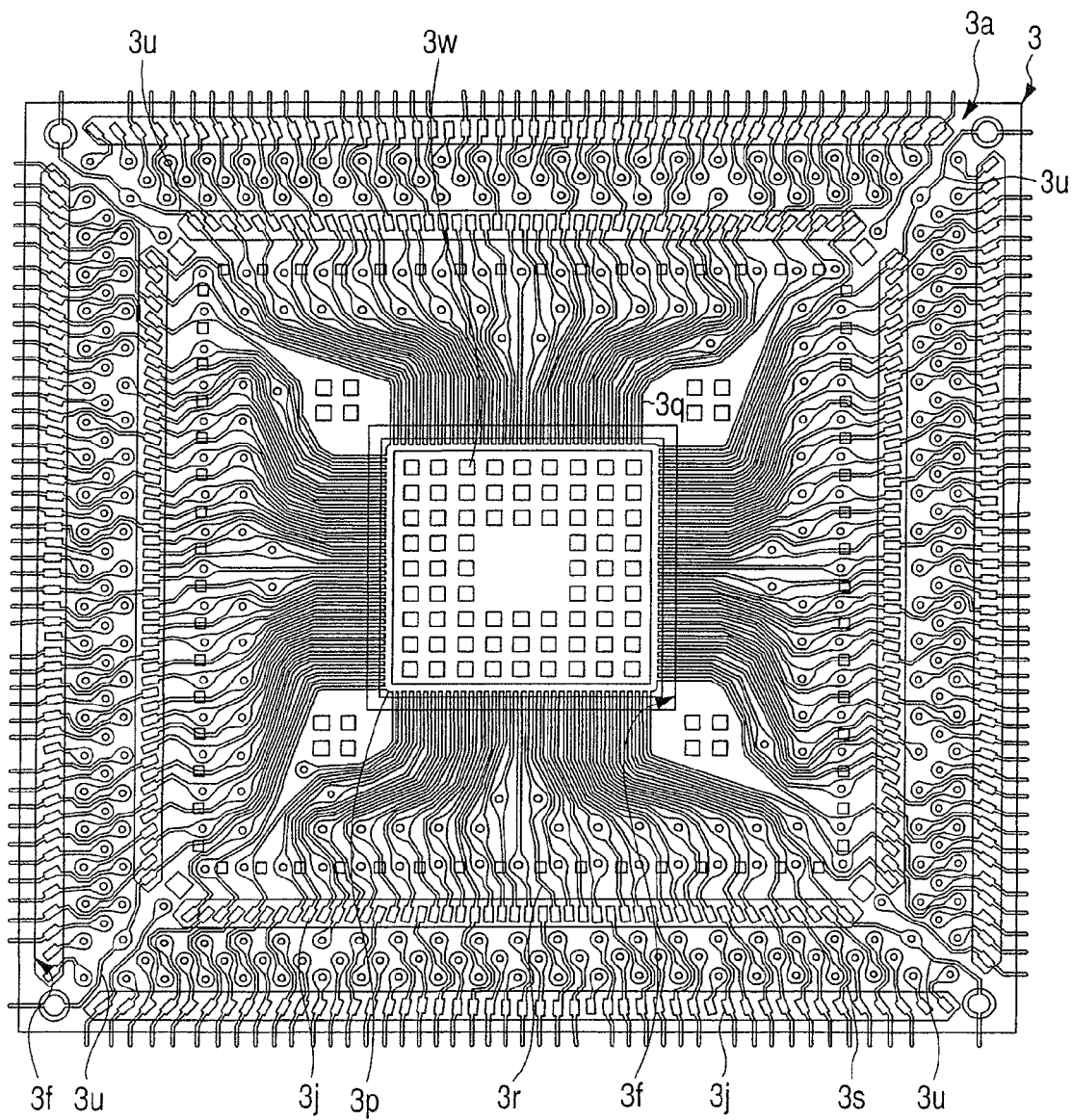
FIG. 11 is a plan view showing an example of the layout of the opening of the resist layer at the side of the main surface of the wiring substrate shown in FIG. 9.
Figure 12:
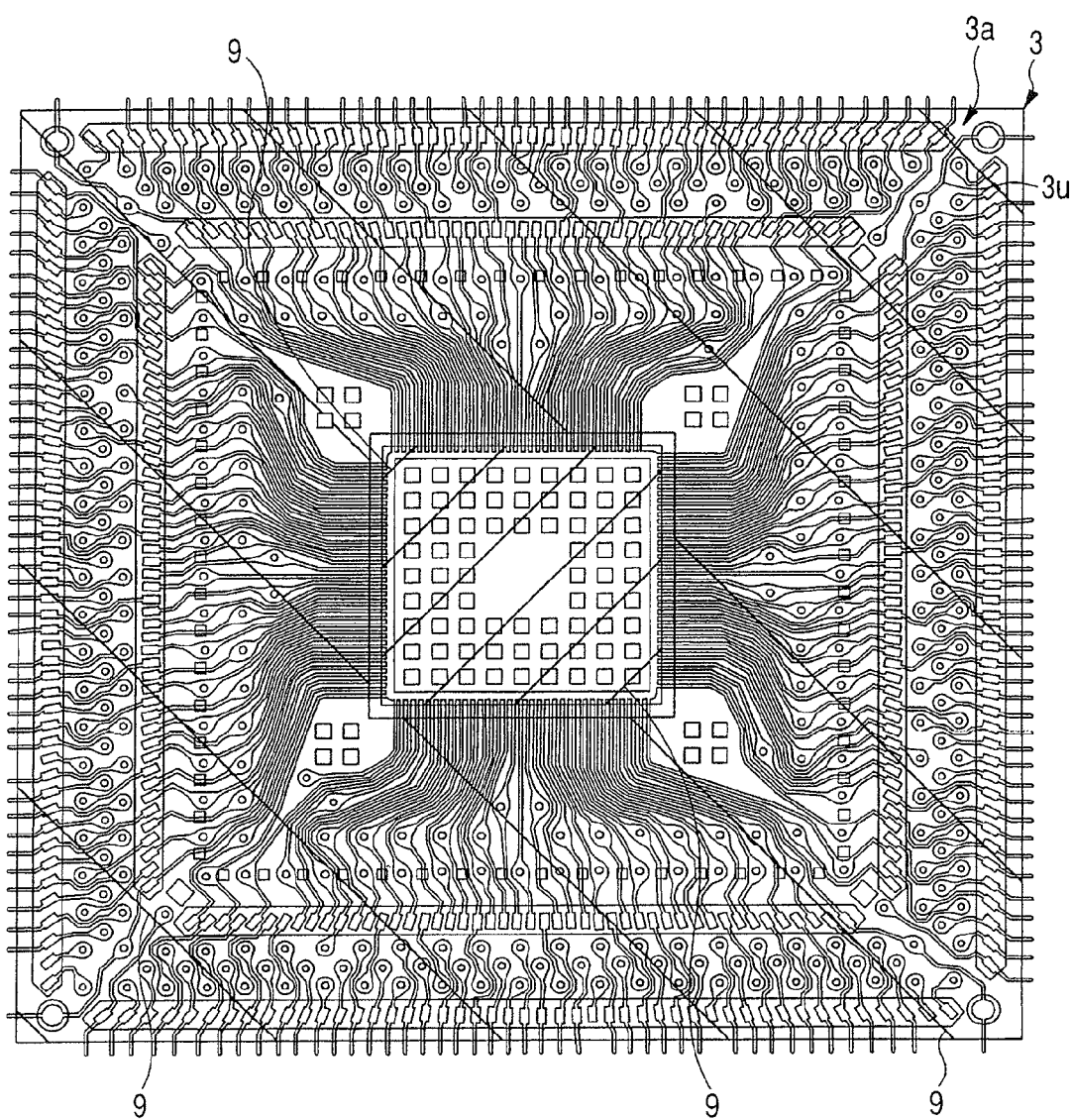
FIG. 12 is a plan view showing an example of the mask area at the time of the etch back in manufacture of the wiring substrate shown in FIG. 9.

FIG. 1 is a cross-sectional view showing an example of the structure of the semiconductor device of the embodiment of the present invention, FIG. 2 is an enlarged partial sectional view showing the structure of the section A shown in FIG. 1, FIG. 3 is an enlarged partial plan view showing an example of the internal structure of the semiconductor device shown in FIG. 1 penetrating a resin body, and FIG. 4 is a back view showing an example of the structure of the semiconductor device shown in FIG. 1. And, FIG. 5 is an enlarged partial sectional view showing an example of the feeder connected to the land part of an outermost periphery of the semiconductor device shown in FIG. 1, FIG. 6 is an enlarged partial sectional view showing an example of the feeder connected to the land part of the 2nd row from the outside, FIG. 7 is an enlarged partial sectional view showing an example of the wiring connected to the land part of the 3rd row and the 4th row from the outside, and FIG. 8 is an enlarged partial sectional view showing an example of the feeder connected to the land part of an innermost circumference of the semiconductor device shown in FIG. 1. Further, FIG. 9 is a plan view showing an example of the wiring pattern of the main surface of the wiring substrate used by the assembly of the semiconductor device shown in FIG. 1, FIG. 10 is a plan view showing an example of the wiring pattern of the back surface of the wiring substrate shown in FIG. 9, FIG. 11 is a plan view showing an example of the layout of the opening of the resist layer at the side of the main surface of the wiring substrate shown in FIG. 9, and FIG. 12 is a plan view showing an example of the mask area at the time of the etch back in manufacture of the wiring substrate shown in FIG. 9.

Figure 9:
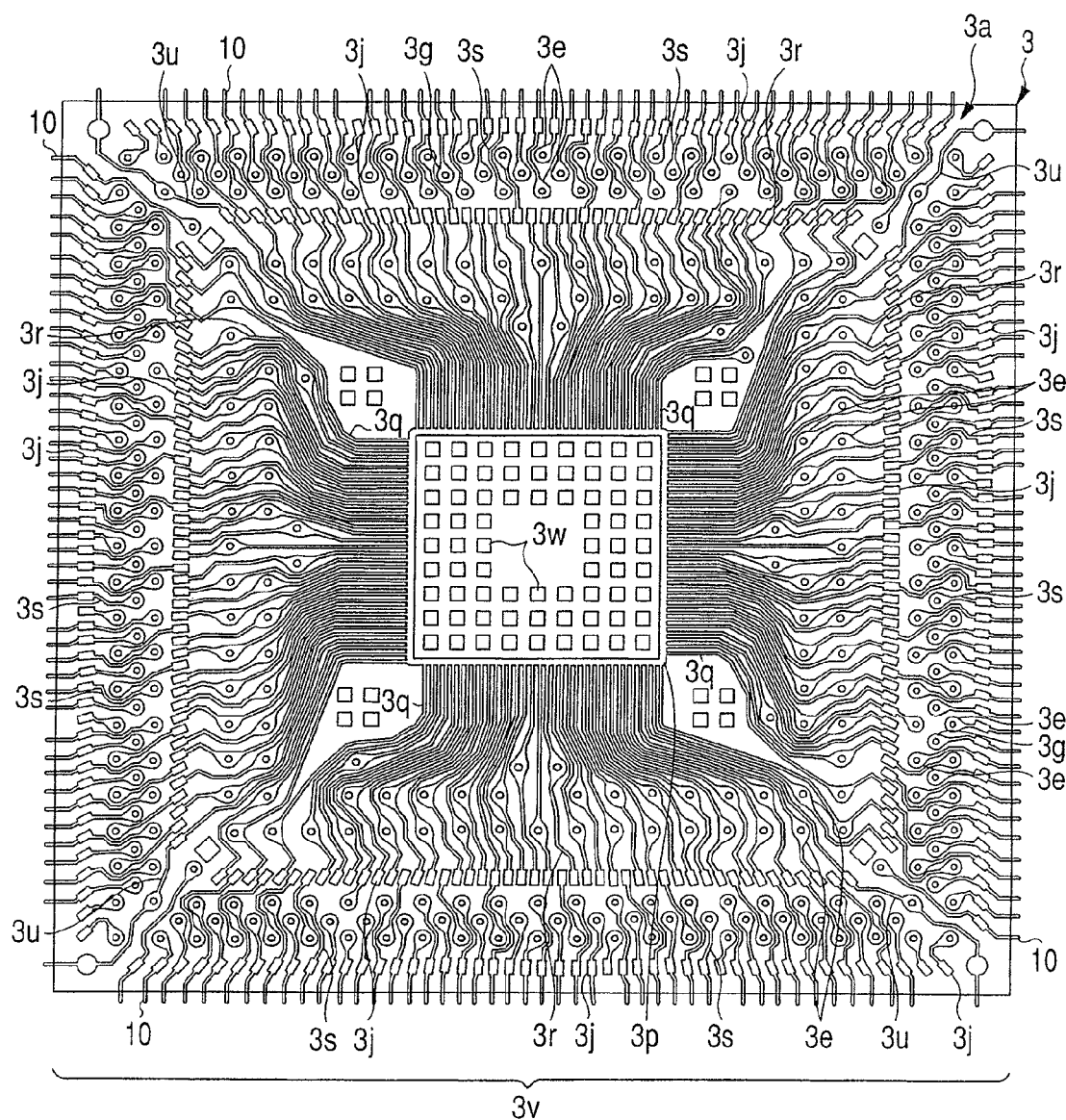
FIG. 9 is a plan view showing an example of the wiring pattern of the main surface of the wiring substrate used by the assembly of the semiconductor device shown in FIG. 1.
Figure 13:
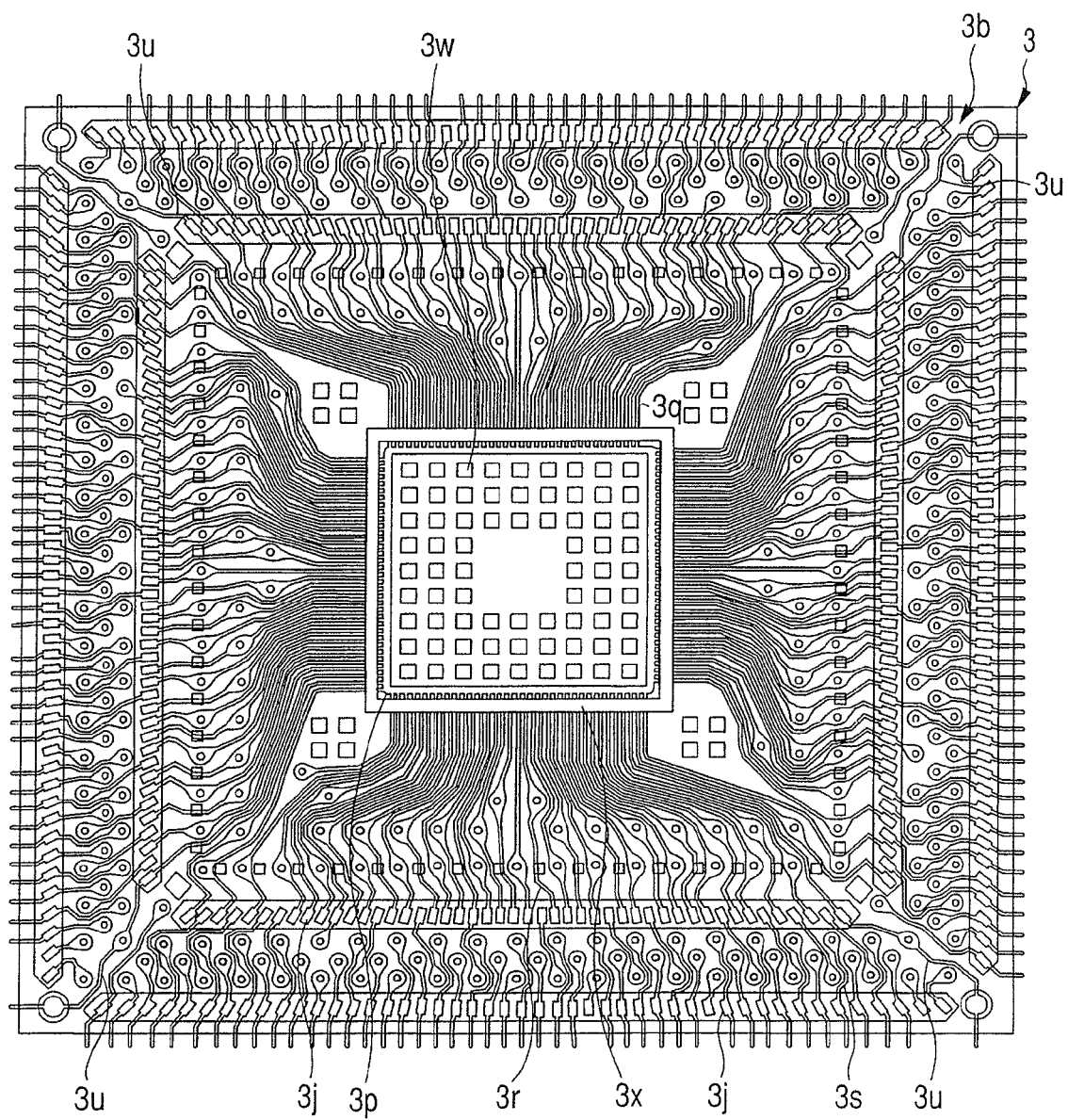
FIG. 13 is a plan view showing an example of the structure after the etch back in manufacture of the wiring substrate shown in FIG. 9.
Figure 14:
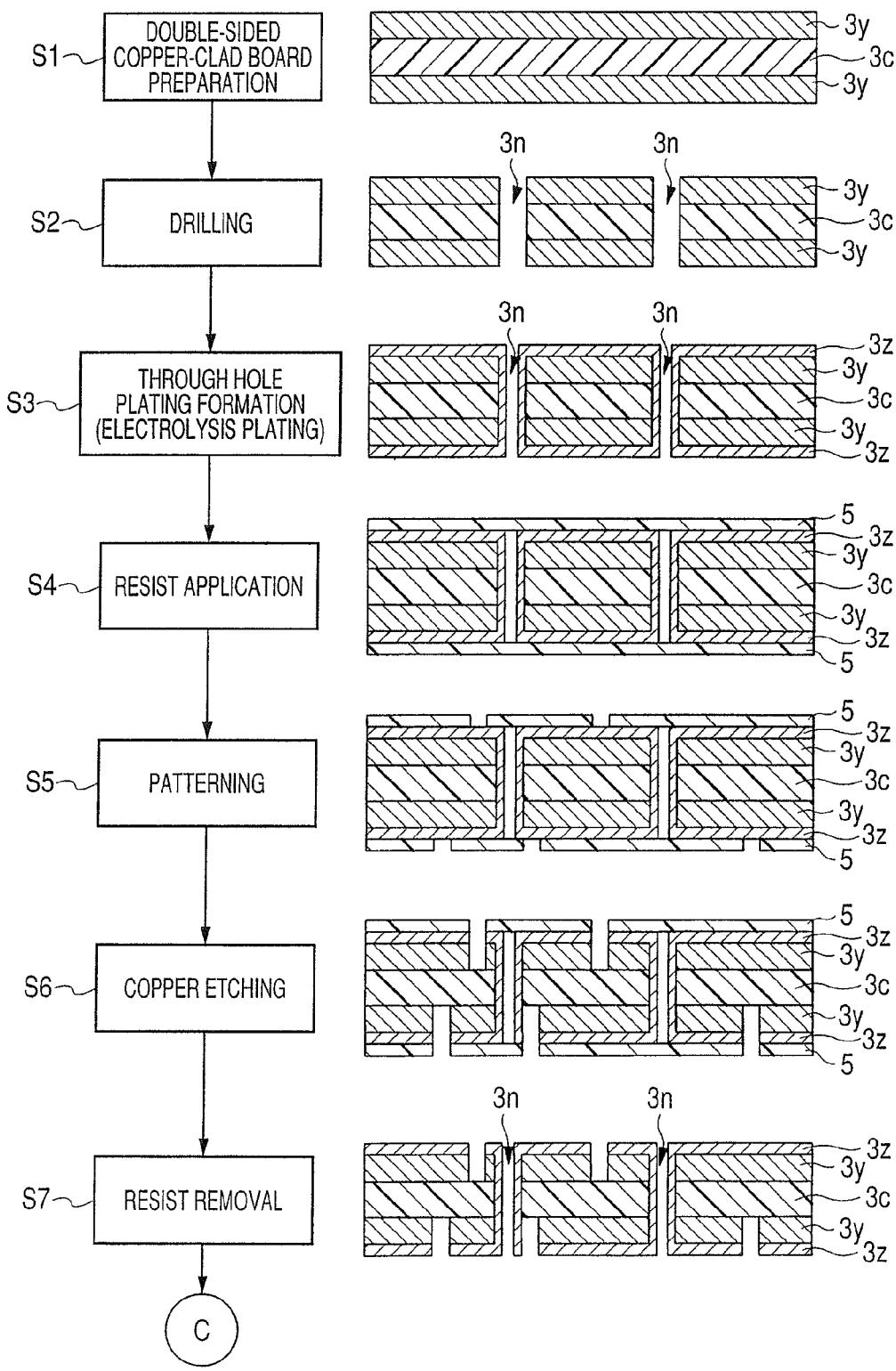
FIG. 14 is a cross-sectional view showing an example of the procedure before an etch back in manufacture of the wiring substrate shown in FIG. 9.
Figure 15:
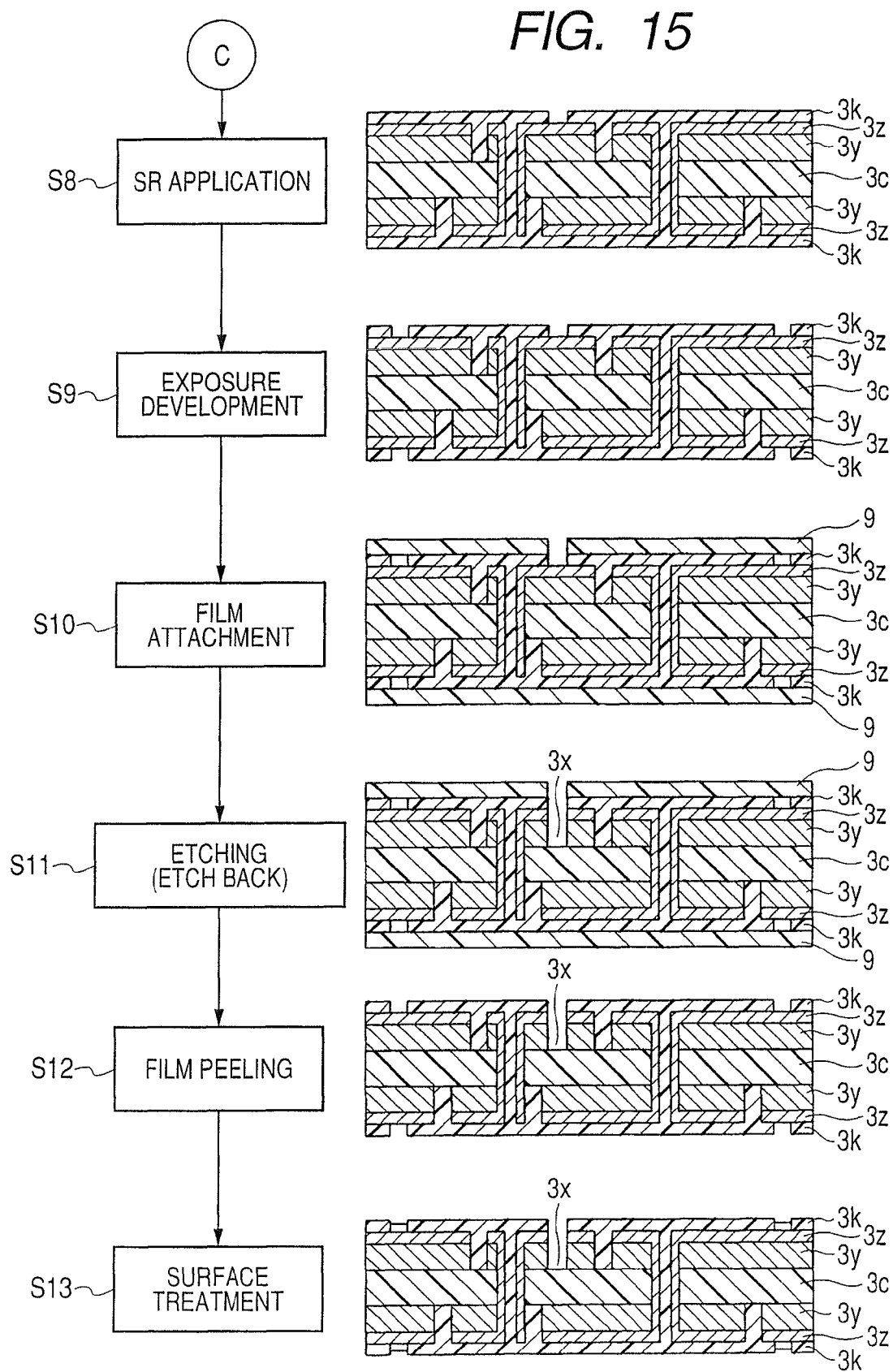
FIG. 15 is a cross-sectional view showing an example of the procedure before and after an etch back in manufacture of the wiring substrate shown in FIG. 9.
Figure 16:
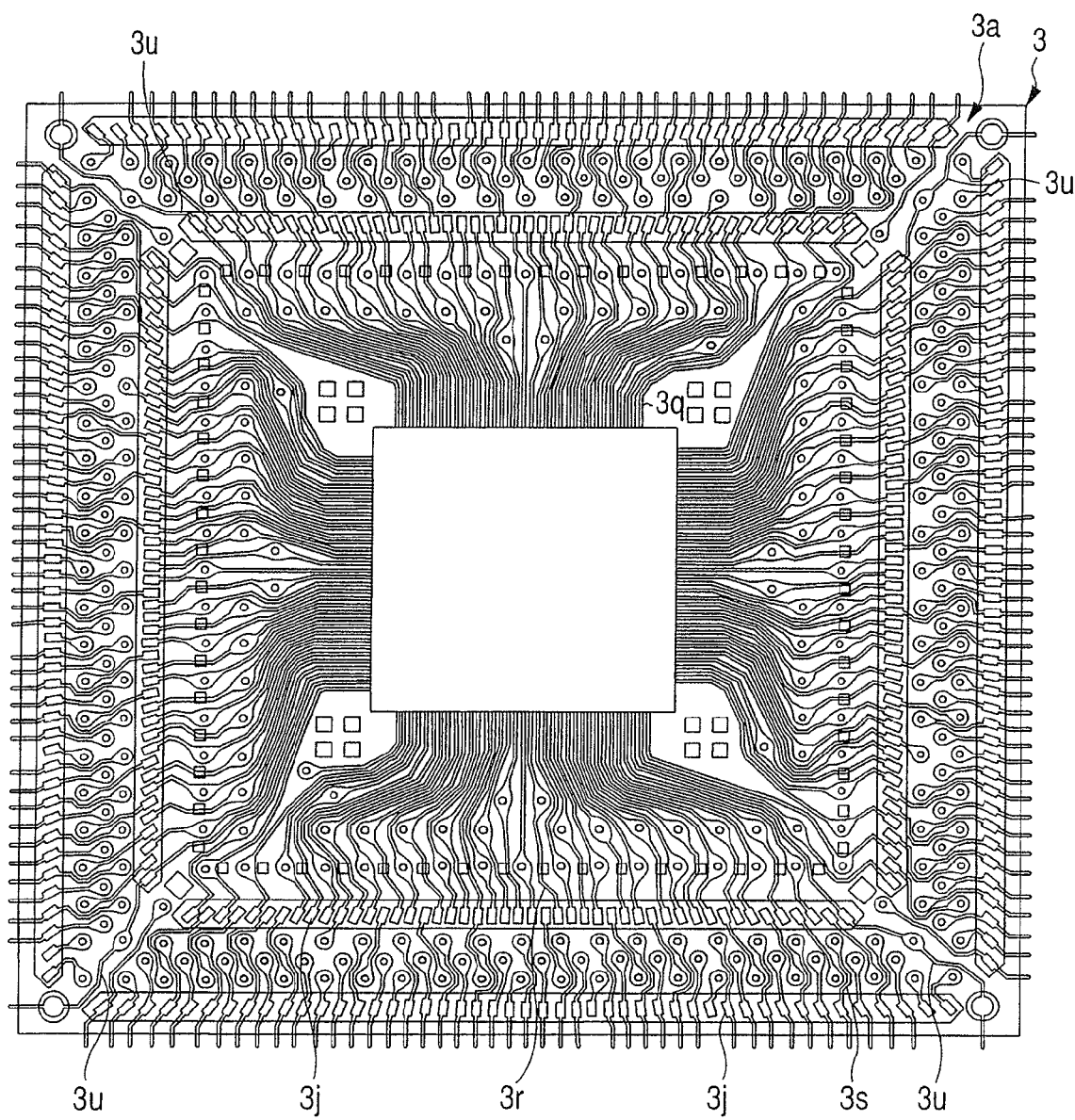
FIG. 16 is a plan view showing the wiring pattern of the main surface of the wiring substrate of a modification.
Figure 17:
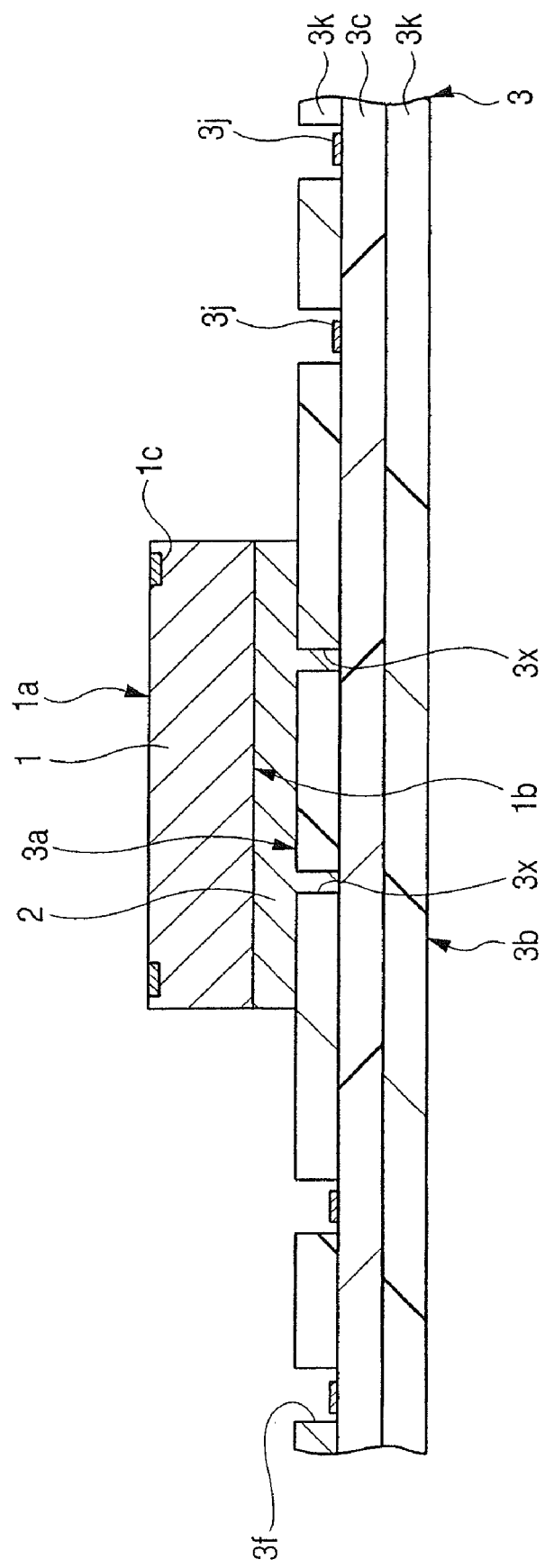
FIG. 17 is a cross-sectional view showing an example of the structure after die bonding in the assembly of the semiconductor device shown in FIG. 1.
Figure 18:
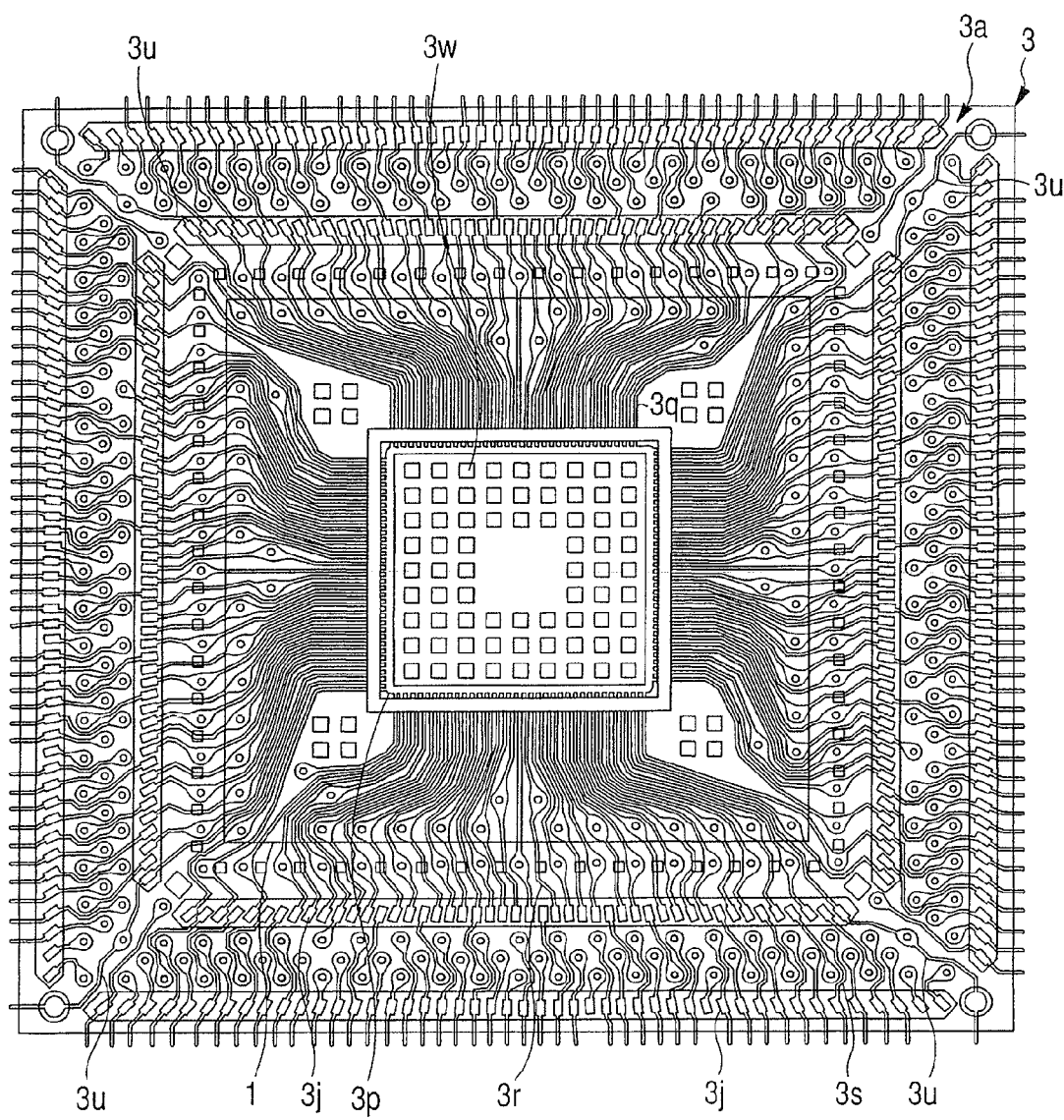
FIG. 18 is a plan view showing an example of the structure after die bonding shown in FIG. 17.
Figure 19:
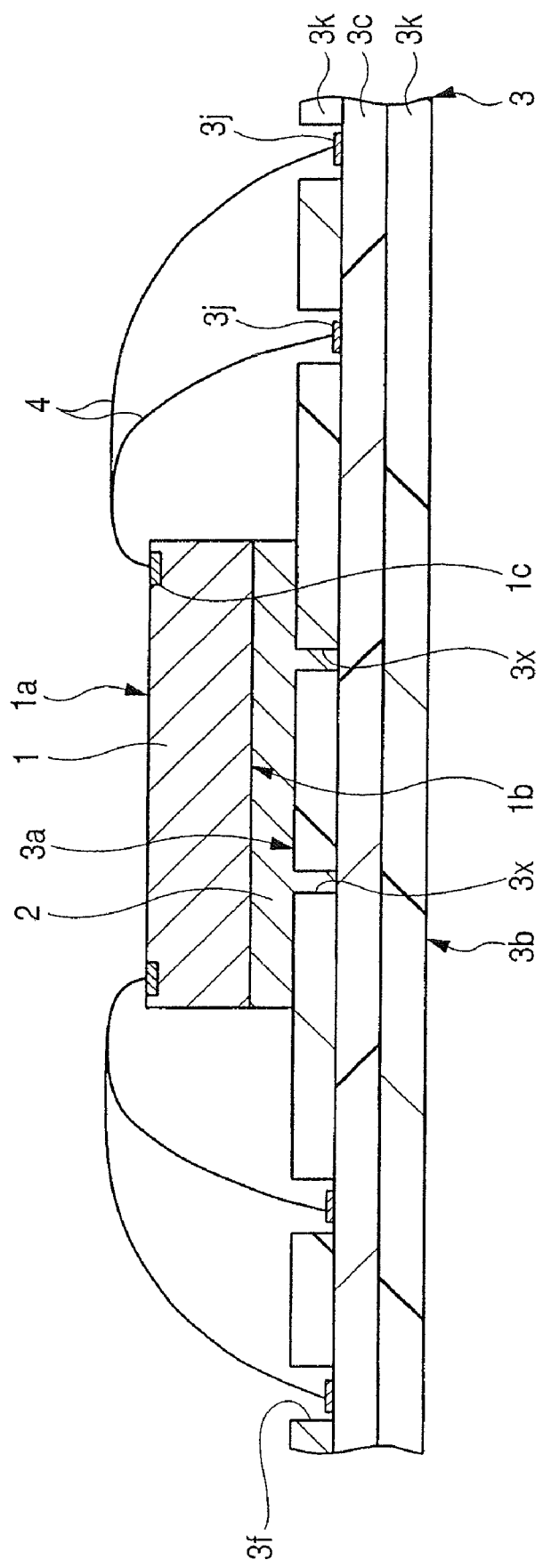
FIG. 19 is a cross-sectional view showing an example of the structure after wire bonding in the assembly of the semiconductor device shown in FIG. 1.
Figure 20:
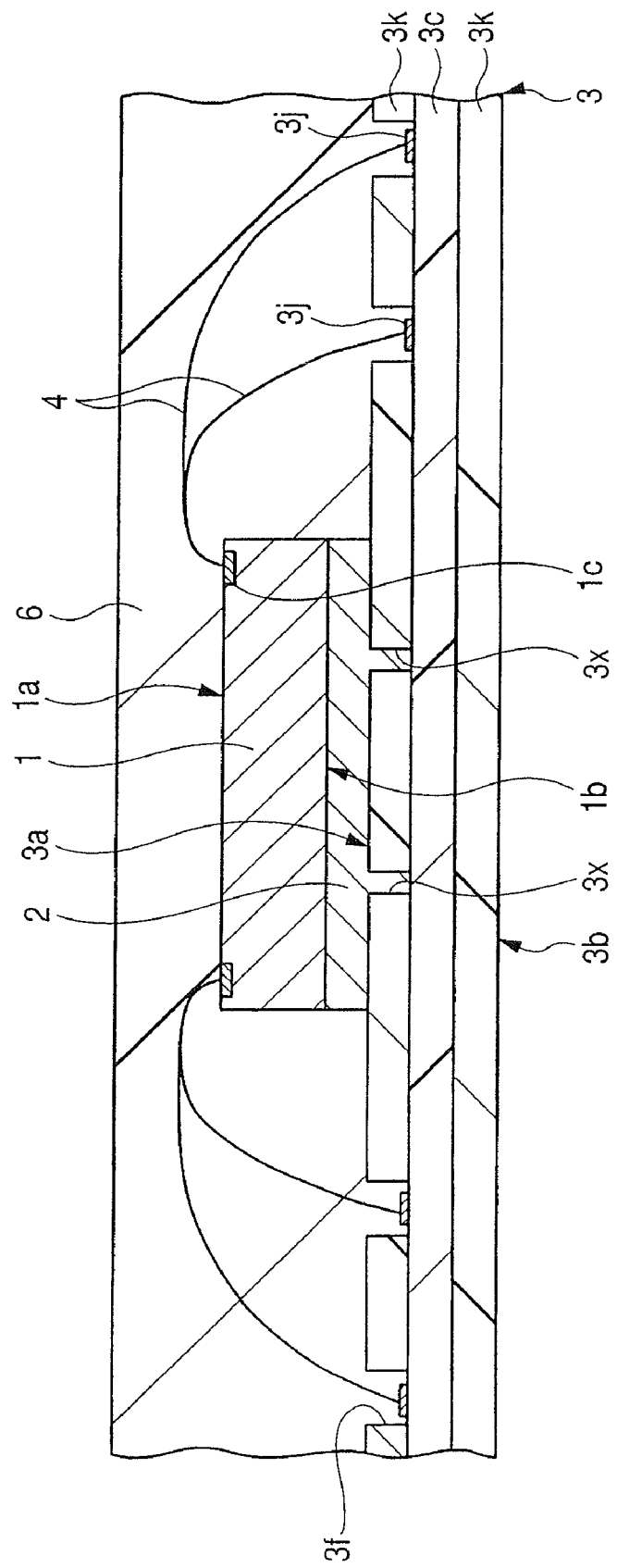
FIG. 20 is a cross-sectional view showing an example of the structure after resin molding in the assembly of the semiconductor device shown in FIG. 1.
Figure 21:
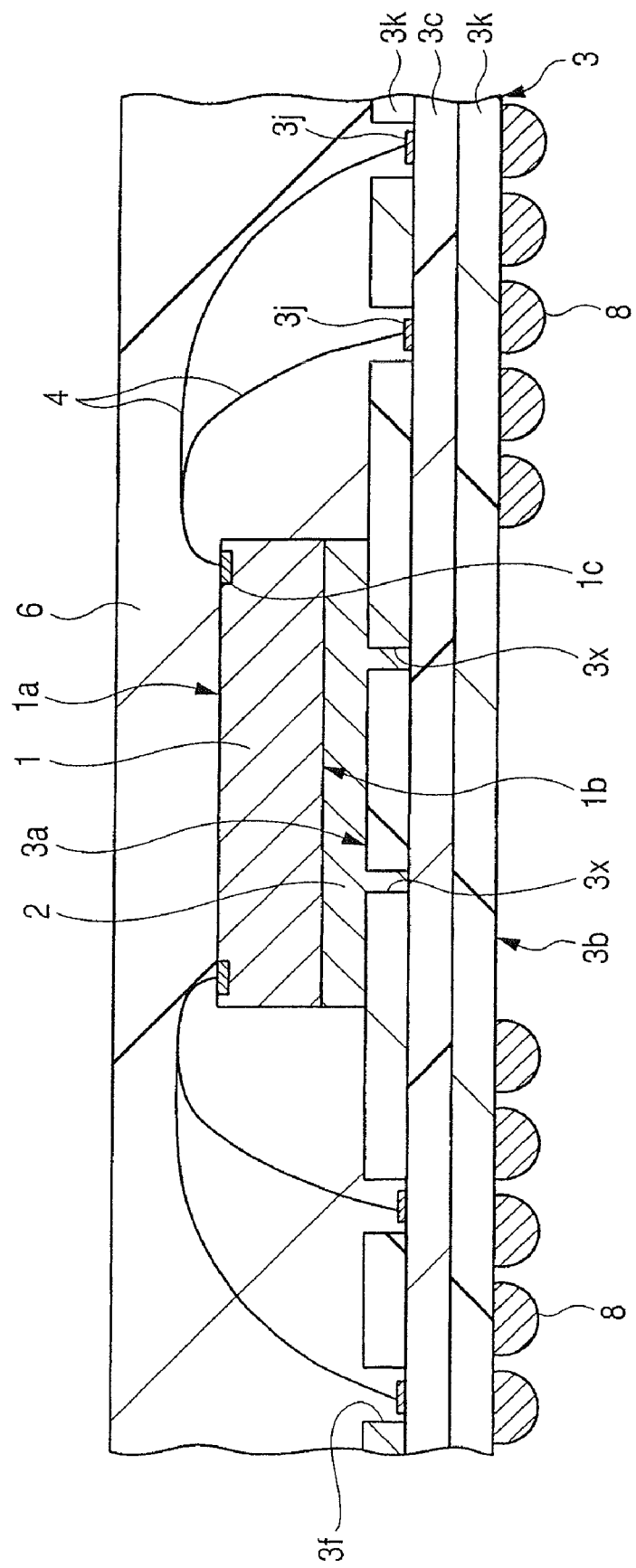
FIG. 21 is a cross-sectional view showing an example of the structure after solder ball mounting in the assembly of the semiconductor device shown in FIG. 1.

And, FIG. 13 is a plan view showing an example of the structure after the etch back in manufacture of the wiring substrate shown in FIG. 9, FIG. 14 is a cross-sectional view showing an example of the procedure before an etch back in manufacture of the wiring substrate shown in FIG. 9, FIG. 15 is a cross-sectional view showing an example of the procedure before and after an etch back in manufacture of the wiring substrate shown in FIG. 9, and FIG. 16 is a plan view showing the wiring pattern of the main surface of the wiring substrate of a modification. Further, FIG. 17 is a cross-sectional view showing an example of the structure after die bonding in the assembly of the semiconductor device shown in FIG. 1, FIG. 18 is a plan view showing an example of the structure after die bonding shown in FIG. 17, FIG. 19 is a cross-sectional view showing an example of the structure after wire bonding, FIG. 20 is a cross-sectional view showing an example of the structure after resin molding, and FIG. 21 is a cross-sectional view showing an example of the structure after solder ball mounting.

The semiconductor device of this embodiment is a semiconductor package of the resin molded type in which semiconductor chip 1 is mounted on a wiring substrate. This embodiment takes up and explains BGA 7 as shown in FIG. 1-FIG. 4 as the example. BGA 7 has external terminals of 300 or more pins, for example and it is a semiconductor package with comparatively many pins. As shown in FIG. 4, solder balls 8 which are a plurality of external terminals are arranged in a lattice manner, and are attached to back surface 3b of a wiring substrate.

When the structure of BGA 7 shown in FIG. 1-FIG. 4 is explained, it consists of package substrate (wiring substrate) 3, semiconductor chip 1 mounted on main surface 3a of package substrate 3, electrically conductive wire 4 which electrically connects pad (electrode) 1c of semiconductor chip 1, and bonding lead (bonding electrode) 3j of main surface 3a of package substrate 3, a plurality of solder balls (external terminals) 8 formed on land parts 3d of back surface 3b of package substrate 3, and resin body 6.

Semiconductor chip 1 is formed with silicon etc., for example, and the integrated circuit is formed in the main surface 1a. The plane form in semiconductor chip 1 which intersects the thickness is rectangular shape, and it is a square in this embodiment. Further, as shown in FIG. 3, a plurality of pads 1c electrically connected with an integrated circuit are formed in the edge part of main surface 1a. This pad 1c, and bonding lead 3j formed on main surface 3a of package substrate 3 are electrically connected by electrically conductive wire 4, respectively. This wire 4 is a gold wire etc., for example.

As shown in FIG. 1, the back surface 1b adheres to package substrate 3 via adhesives 2, such as a paste agent and a die attach film, and semiconductor chip 1 is mounted in package substrate 3, where main surface 1a is turned up.

Resin body 6 is formed in the main surface 3a side of package substrate 3, and does the resin seal of semiconductor chip 1 and a plurality of electrically conductive wires 4, for example while it consists of epoxy system resin etc.

Solder balls 8 which are a plurality of external terminals formed in back surface 3b of package substrate 3 consist of solder, such as Pb—Sn, for example, and as shown in FIG. 4, they are formed in back surface 3b of package substrate 3 in a lattice manner, for example by five-row arrangement.

Here, as shown in FIG. 1 and FIG. 2, package substrate 3 has main surface 3a, back surface 3b opposite to main surface 3a, core material 3c, a plurality of conductor patterns formed in main surface 3a, a plurality of conductor patterns formed in back surface 3b, and solder-resist film 3k which covers this conductor pattern except for a part of conductor patterns and which is an insulating film.

That is, package substrate 3 of this embodiment is a substrate of the two-layer wiring structure by which the conductor pattern was formed in the main surface 3a and back surface 3b. Solder-resist film 3k is formed in each front surface of main surface 3a and back surface 3b, and a plurality of bonding leads 3j are exposed in openings 3f of solder-resist film 3k at the main surface 3a side. On the other hand, in the back surface 3b, each land part 3d is exposed from solder-resist film 3k.

As shown in FIG. 3 and FIG. 9, a plurality of bonding leads 3j and a plurality of via hole parts (through hole) connected to each bonding lead 3j via wiring part 3i are formed in main surface 3a of package substrate 3. A plurality of bonding leads 3j are arranged in two rows at an edge part and its inside of main surface 3a.

On the other hand, as shown in FIG. 2 and FIG. 10, a plurality of land parts 3d, lead-out wirings 3h connected to a part of land parts 3d of a plurality of land parts 3d, and via hole parts (through holes) connected to lead-out wiring 3h are formed in back surface 3b of package substrate 3, respectively. A plurality of land parts 3d are formed along with five rows along the peripheral part of back surface 3b in the case.

Therefore, a plurality of bonding leads 3j formed in main surface 3a are electrically connected to the land part 3d of back surface 3b via the via hole part (through hole) which corresponds, respectively. In addition, conductor patterns, such as bonding lead 3j, wiring part 3i, the via hole part (through hole) of main surface 3a, and land part 3d, wiring part 3i, a via hole part (through hole), etc. of back surface 3b, are formed with the copper alloy, for example, and electrolysis plating processing is performed to the conductor pattern. That is, the feeder is connected to each conductor pattern. Electric supply is performed from a feeder and plating film 3z is formed in the surface (a plurality of bonding leads, a plurality of land parts) in each conductor pattern exposed from solder-resist film 3k. Plating film 3z consists of each film of gold and nickel, for example.

The plane form in package substrate 3 which intersects the thickness is rectangular shape, and it is a square in this embodiment.

A plurality of via hole parts formed in package substrate 3 of this embodiment include, as shown in a drawing, first through hole part (first via hole part) 3e pulled out and arranged by lead-out wiring 3h connected to land part 3d in the plane direction, and second through hole parts (second via hole part) 3g which have been arranged on land part 3d (position which overlaps with land part 3d in plan view) and which are called what is called a pad-on via hole. That is, first through hole part 3e pulled out and arranged from land part 3d in the plane direction and second through hole part 3g which is a pad-on via hole are loaded together and formed in package substrate 3, and a plurality of each is formed.

The via hole parts, such as first through hole part 3e and second through hole part 3g, are formed from the through hole 3n formed in core material 3c, and the conductor film 3m arranged inside through hole 3n. That is, conductor film 3m is formed in the inner wall of through hole 3n, and this conductor film 3m is connected with the conductor pattern at the side of main surface 3a, and the conductor pattern at the side of back surface 3b. It may fill up only with conductor film 3m inside through hole 3n, and conductor film 3m and an insulating film may be arranged in it.

Here, since a pad-on via hole (second through hole part 3g) is arranged directly on land part 3d, it does not need lead-out wiring 3h, therefore even if it is the narrow limited region, it can be arranged. That is, it is more effective to form a pad-on via hole in the region where wiring density is comparatively high.

However, on the one hand, a pad-on via hole has the low strength of the conductor part arranged to the inside as compared with first through hole part 3e pulled out by lead-out wiring 3h. Therefore, at the time of wire bonding, it is easy to generate a crack in conductor film 3m according to the bonding weight (load by a capillary) given as compared with bonding lead 3j connected with the via hole part spaced out in plan view via lead-out wiring 3h. Therefore, it is more desirable to avoid arranging a pad-on via hole to the region in a substrate where stress tends to concentrate. As for a pad-on via hole, arranging to the region where stress cannot concentrate easily is preferred.

That is, in package substrate 3, when performing mixed loading of first through hole part 3e pulled out by lead-out wiring 3h and the second through hole part 3g which is a pad-on via hole, they must be formed in consideration of the locating position of a pad-on via hole.

For example, in package substrate 3, stress tends to concentrate more at the more distant position from the center of package substrate 3. Therefore, since the second through hole part 3g which is a pad-on via hole has the low strength of the conductor film 3m arranged to the inside compared with first through hole part 3e pulled out by lead-out wiring 3h, it is more desirable not to arrange second through hole part 3g to the land part 3d of an outermost periphery. That is, it is more desirable to connect the land part 3d arranged at the outermost periphery to first through hole part 3e among a plurality of land parts 3d via lead-out wiring 3h.

Further, as shown in FIG. 3, on the extension line of the diagonal line of semiconductor chip 1 of package substrate 3, it is preferred that first through hole part 3e with high strength is arranged. That is, since it is easy to concentrate stress near the corner part comprising diagonal line upper part of package substrate 3, it is preferred to arrange first through hole part 3e whose strength of internal conductor film 3m is comparatively high, and to make it not arrange a pad-on via hole (second through hole part 3g).

As for bonding lead 3j formed in main surface 3a of package substrate 3, as shown in FIG. 2, it is preferred to connect with the via hole part (first through hole part 3e, second through hole part 3g) formed in the position spaced out in plan view via lead-out wiring 3h. Since a diameter of a via hole is larger than the disposing pitch of bonding lead 3j, as described above, when forming a via hole part directly under bonding lead 3j and trying to draw around to the back surface 3b side of package substrate 3, one via hole part will be arranged ranging over a plurality of bonding leads 3j. Therefore, the adjacent bonding leads will electrically short-circuit via a via hole part. In order to suppress this short circuit, the disposing pitch of bonding lead 3j must be made larger than the diameter of a via hole part, and hereby, the miniaturization of package substrate 3 becomes difficult. Therefore, it is preferred to connect to bonding lead 3j the via hole part (first through hole part 3e, second through hole part 3g) formed in the position spaced out in plan view via lead-out wiring 3h without arranging a pad-on via hole (second through hole part 3g).

In BGA 7 of this embodiment, as shown in FIG. 9, a plurality of bonding leads 3j are arranged along with two rows in main surface 3a of package substrate 3 at an edge part and its inside. On the other hand, as shown in FIG. 10, a plurality of land parts 3d are formed in back surface 3b along with five rows along the peripheral part.

That is, as shown in FIG. 9, a plurality of bonding leads (first bonding leads) 3j are arranged at the outermost periphery of main surface 3a. Further, via hole parts, such as first through hole part 3e and second through hole part 3g, are arranged covering three rows in the inside. A plurality of bonding leads (second bonding leads) 3j are arranged at the inside. Then, since it is more desirable not to arrange a pad-on via hole (second through hole part 3g) directly under bonding lead 3j and at an outermost periphery, the land part 3d connected to first through hole part 3e via lead-out wiring 3h is arranged at the outermost periphery of back surface 3b.

Inside bonding lead 3j is arranged at main surface 3a side of package substrate 3 which corresponds between the land part 3d of the 3rd row, and the land part 3d of the 4th row from the outside. Since it is more desirable not to arrange a pad-on via hole (second through hole part 3g) directly under bonding lead 3j, the land part 3d connected to first through hole part 3e via lead-out wiring 3h is arranged also directly under bonding lead 3j inside main surface 3a. The land part 3d of this row constitutes a row of the land part 3d of the 3rd row from the outside.

Therefore, in back surface 3b of package substrate 3, a plurality of pad-on via holes (second through hole part 3g) are arranged on the land part 3d of the 2nd row from the outside of the land parts 3d of five rows, corresponding to the region between bonding lead 3j of the outermost periphery, and inside bonding lead 3j at the side of main surface 3a.

In the case, in back surface 3b, lead-out wiring 3h connected to the land part 3d of an outermost periphery is pulled out towards the inside, and first through hole part 3e is connected to the end portion. Lead-out wiring 3h connected to the land part 3d of the 3rd row from the outside is pulled out towards an outside, and first through hole part 3e is connected to the end portion.

Therefore, the pad-on via hole (second through hole part 3g) arranged on the land part 3d of the 2nd row from the outside is sandwiched and arranged by first through hole part 3e in the direction which goes inside from the outside.

That is, since the land part 3d of the 2nd row from the outside and, in addition at the circumference, first through hole part 3e are arranged in the region between the land part 3d of an outermost periphery, and the land part 3d of the 3rd row from the outside, it becomes a region of a high-density wiring dramatically. Therefore, it is very effective to arrange the second through hole part 3g which does not need lead-out wiring 3h and which is a pad-on via hole to this region also from a viewpoint that there are few wiring spaces.

Plating line 10 extending and existing from bonding lead 3j of an outermost periphery to the outside is extending and existing to the outside further straddling the borderline of the periphery of device region 3v.

Here, in package substrate 3 of BGA 7 of this embodiment, as mentioned above, electrolysis plating processing is performed to conductor patterns, such as bonding lead 3j, wiring part 3i and the via hole part (through hole) of main surface 3a, land part 3d, wiring part 3i, a via hole part (through hole) of back surface 3b. That is, the feeder is connected to each conductor pattern, electric supply is performed from a feeder and plating is formed in the front surface of each conductor pattern.

However, as mentioned above, in back surface 3b of package substrate 3, five rows are covered with land part 3d covering all of the perimeter. In the region between the land part 3d of an outermost periphery, and the land part 3d of the 3rd row from the outside, first through hole part 3e is arranged with the land part 3d of the 2nd row at the circumference from the outside, in addition. Therefore, it is a region of the high-density wiring dramatically, and it is in the difficult state to connect a feeder to each conductor pattern simply.

So, in package substrate 3 of BGA 7 of this embodiment, it has the feature in the wiring of a feeder.

As shown in FIG. 9, common wiring 3p for electric supply is formed in the inner area of a plurality of bonding leads 3j which covered the perimeter and were formed by two rows in main surface 3a of device region 3v of package substrate 3. This common wiring 3p is formed in ring shape. That is, in main surface 3a of package substrate 3, common wiring 3p for electric supply of a ring shape which accomplishes a quadrangle is formed near the center of the inner area of a plurality of bonding leads 3j formed by two-row arrangement.

A plurality of plating lines (lead-out wiring for electric supply) 3q are connected to common wiring 3p for electric supply of quadrangular ring shape to each of the four sides. A plurality of plating lines 3q are extending and existing toward the outside of a substrate of four directions, respectively. Each plating line 3q is connected to bonding lead 3j of the inside of the bonding leads 3j of two-row arrangement, and first through hole part 3e (via hole part) arranged further at the inside.

Therefore, the land part 3d of the innermost circumference, and the 2nd row from the inside among the land parts 3d arranged at five rows of back surface 3b is connected to plating line 3q (first plating line 3r) of main surface 3a via the via hole part. This first plating line 3r is connected to common wiring 3p. The land part 3d of the 2nd row and the 3rd row from the outside is connected to second plating line 3s of main surface 3a via the via hole part. This second plating line 3s is extending and existing to the end portion of package substrate 3.

Further, as for the land part 3d of the outermost periphery, in back surface 3b, third plating line 3t connected to land part 3d is extending and existing directly to the end portion of package substrate 3. As shown in FIG. 9 here, when electrically connecting with bonding lead (first bonding lead) 3j of the periphery of package substrate 3 in the land part 3d of an outermost periphery, the land part 3d of an outermost periphery may connect with bonding lead 3j of the periphery of main surface 3a of package substrate 3 via a via hole part, and may be further connected to plating line 10 extending and existing from bonding lead 3j of a periphery to the outside.

As for outside bonding lead 3j among bonding leads 3j of two rows of main surface 3a, plating line 10 connected to this is extending and existing directly to the end portion of package substrate 3. On the other hand, as for inside bonding lead 3j, the thing connected to common wiring 3p by first plating line 3r, and the thing extending and existing to the end portion of package substrate 3 by the back surface 3b side via first through hole part 3e are intermingled.

Further, fourth plating line 3u extending and existing from common wiring 3p to a substrate end is formed in four corner parts of main surface 3a of package substrate 3.

Therefore, in package substrate 3 of this embodiment, about the land part 3d from the outermost periphery to the 3rd row of back surface 3b, bonding lead 3j of the outside of main surface 3a, and inside bonding lead 3j of a portion further, electric supply is directly performed via the feeder to extend and exist to the end portion of a substrate. About the land part 3d from the innermost circumference to the 2nd row of back surface 3b, and a part of bonding leads 3j of insides of main surface 3a, electric supply is performed via fourth plating line 3u, common wiring 3p, and first plating line 3r.

Here, the detail of the wiring of the land part 3d of back surface 3b is explained. First, as shown in FIG. 5 and FIG. 10, the third plating line 3t extending and existing to the end portion of package substrate 3 is connected to each land part 3d of the outermost periphery of back surface 3b of package substrate 3, respectively. That is, since the land part 3d of an outermost periphery is very near to the end portion of a substrate, it is directly connected with the outside by third plating line 3t. Therefore, electric supply to each land part 3d of the outermost periphery in the case of plating formation is directly performed via the third plating line 3t of back surface 3b from the outside.

As shown in FIG. 6 and FIG. 10, second through hole part 3g (referring to the FIG. 2, pad-on via hole) and lead-out wiring 3h are connected to the land part 3d of the 2nd row and the 3rd row of back surface 3b of package substrate 3 from the outside, respectively. The land part 3d of the 2nd row from the outside is connected with the second plating line 3s extending and existing to the end portion of package substrate 3 at the main surface 3a side via second through hole part 3g. The land part 3d of the 3rd row is pulled out to the plane direction, connects with first through hole part 3e, and is further connected with the second plating line 3s extending and existing to the end portion of package substrate 3 by lead-out wiring 3h at the main surface 3a side. That is, the land part 3d of the 2nd row and the 3rd row from the outside is pulled out by second through hole part 3g or first through hole part 3e to the main surface 3a side, and it is pulled out by second plating line 3s to the end portion of the substrate at the main surface 3a side.

Therefore, electric supply to the land part 3d of the 2nd row and the 3rd row from the outside in the case of plating formation is performed via the second plating line 3s of main surface 3a, second through hole part 3g or first through hole part 3e, and lead-out wiring 3h of back surface 3b from the outside.

As shown in FIG. 7, 8, and FIG. 10, the land part 3d of the innermost circumference, and the 2nd row from the inside of back surface 3b of package substrate 3 is connected to lead-out wiring 3h, is pulled out to the plane direction by this lead-out wiring 3h, connects with first through hole part 3e, and connects with first plating line 3r which extends and exists to an inner side and connects with common wiring 3p at the main surface 3a side further. That is, the land part 3d of an innermost circumference, and the 2nd row from the inside is pulled out by first through hole part 3e to the main surface 3a side, and is connected to common wiring 3p by first plating line 3r at the main surface 3a side.

Further, as shown in FIG. 9, fourth plating line 3u which connects to common wiring 3p, and extends and exists from this common wiring 3p to a substrate end is formed in four corner parts of main surface 3a of package substrate 3. That is, since the space is slightly left behind to the corner part of main surface 3a of package substrate 3 on the arrangement of two rows of bonding lead 3j, fourth plating line 3u extending and existing from the end portion of a substrate to common wiring 3p is formed there. Why this space is left behind is explained. As shown in FIG. 1, semiconductor chip 1 is mounted in the region surrounded by the row of inside bonding lead 3j of main surface 3a of package substrate 3. After mounting semiconductor chip 1, pad 1c of semiconductor chip 1, and outside bonding lead 3j and inside bonding lead 3j of package substrate 3 are electrically connected via a plurality of wires 4, respectively. At this time, a length of one side of semiconductor chip 1 is shorter than a length of one side of package substrate 3. Therefore, when outside bonding lead 3j is arranged to near the corner part of package substrate 3, the length of wire 4 which electrically connects bonding lead 3j near the corner part of package substrate 3 and pad 1c of semiconductor chip 1 corresponding to it will become long. Therefore, it becomes difficult to form the stable loop shape of wire 4. Since bonding lead 3j is not arranged near the corner part of package substrate 3 with this reason, it is possible to draw around inside plating line 3q of package substrate 3. On the other hand, since a plurality of land parts 3d are arranged in a lattice manner at the back surface 3b side of package substrate 3 as shown in FIG. 4, compared with near the corner part at the side of main surface 3a, there is no space near a corner part in back surface 3b of package substrate 3.

Therefore, electric supply to the land part 3d of an innermost circumference and the 2nd row in the case of plating formation is performed via fourth plating line 3u, common wiring 3p, first plating line 3r and first through hole part 3e of main surface 3a, and lead-out wiring 3h of back surface 3b from the outside.

Thus, even if it is multi pin BGA 7 in which land parts 3d are arranged in five rows covering all of the perimeter in back surface 3b of package substrate 3, and the region between the land part 3d of an outermost periphery and the land part 3d of the 3rd row from the outside has become a high-density wiring, it is possible to be able to connect plating line 3q for feeders to each land part 3d, to perform electric supply for plating, and to form the plating film of gold and nickel on a wiring and an electrode.

After plating formation, by etching (etch back), cutting separation of ring shape common wiring 3p, and a plurality of first plating lines 3r and fourth plating lines 3u which are connected with this is done, and each lead-out wiring for electric supply is insulated.

Each land part 3d connected with a plurality of first plating lines 3r connected to common wiring 3p may be the land part 3d for signals, and may be the land part 3d for a power supply or grounds. Namely, in the case of land part 3d for signals, since each first plating line 3r, and the land part 3d connected with this are insulated by doing cutting separation of common wiring 3p and the first plating line 3r by etching after plating formation, such land parts 3d may be for signals. In the case of land part 3d for a power supply or grounds, by leaving only the portion where such land parts 3d connect to common wiring 3p via first plating line 3r, without etching, communizing as a power supply or a ground is possible, and stabilization of a power supply or a ground can be aimed at.

As shown in FIG. 9 and FIG. 10, dummy patterns 3w of a plurality of small quadrangles are formed in the almost central part of main surface 3a and back surface 3b of package substrate 3. A plurality of these dummy patterns 3w are formed in the open area of the substrate at an almost equal gap, by this, can ease the local stress concentration in a substrate, and can reduce a warp of a substrate.

Next, according to the manufacturing flow shown in FIG. 14 and FIG. 15, the formation method of package substrate 3 including the etch back which does cutting separation of the lead-out wiring for electric supply is explained.

First, as shown in Step S1 of FIG. 14, double-sided copper-clad board preparation is made. That is, the board with which copper material 3y was stuck on back-and-front both faces of core material 3c is prepared. Then, drilling shown in Step S2 is performed, and a plurality of through holes 3n are formed. That is, a plurality of through holes 3n are formed in a predetermined position by drilling.

Then, through hole plating formation shown in Step S3 is performed. Here, plating film 3z of gold and nickel is formed in the back-and-front surface, and in through hole 3n of the board with electrolysis plating, respectively. In package substrate 3 of this embodiment, plating line 3q for feeders is electrically connected to each of the land part 3d directly or via common wiring 3p in the case. Therefore, plating film 3z of gold and nickel can be formed on each wiring and electrode by performing electric supply for plating.

Then, the resist application shown in Step S4 is performed. Here, resist is applied and resist layer 5 which covers plating film 3z of a back-and-front surface is formed. Then, patterning shown in Step S5 is performed. That is, the prescribed spot of resist layer 5 is made to have an opening according to a pattern.

Then, copper etching shown in Step S6 is performed. Here, etching removes lower plating film 3z and lower copper material 3y of the part which has an opening with patterning of Step S5. Then, resist removal shown in Step S7 is performed. Here, resist layer 5 formed in the back-and-front surface at Step S4 is removed.

By this, the wiring pattern of the back-and-front surface shown in FIG. 9 and FIG. 10 is formed.

Then, SR (solder-resist film 3k) coating shown in Step S8 of FIG. 15 is performed. That is, solder-resist film 3k is applied to the back-and-front surface of plating film 3z, and the part which has an opening.

Then, exposure development shown in Step S9 is performed. Here, exposure development of two or more predetermined parts comprising the part where an etch back is performed eventually is performed, and as shown in FIG. 11, opening 3f is formed in solder-resist film 3k. Then, film attachment shown in Step S10 is performed. Here, film 9 in which only the part (circumference of common wiring 3p at the side of main surface 3a of a substrate) where an etch back is performed made an opening is stuck from the upper part of solder-resist film 3k. That is, as shown in FIG. 12, only the region which performs an etch back is made to have an opening in ring shape, and the other regions are covered with film 9.

Then, etching (etch back) shown in Step S11 is performed. Here, etching removes copper material 3y and plating film 3z of a prescribed spot. That is, as shown in FIG. 12, etching is done in the state where it covered with film 9 which is a mask (the slash part of FIG. 12 is film 9), and cutting separation of common wiring 3p, and first plating line 3r and fourth plating line 3u is done by this.

Then, film peeling shown in Step S12 is performed. That is, by removing film 9 of a back-and-front surface, as shown in FIG. 13, recess 3x is formed in the circumference of common wiring 3p at ring shape. As a result, ring shape common wiring 3p, and first plating line 3r and fourth plating line 3u do cutting separation.

Then, the surface treatment shown in Step S13 is performed. Here, processing which fills unnecessary opening 3f of solder-resist film 3k is performed.

This becomes the completion of manufacture of package substrate 3.

Next, the modification of this embodiment shown in FIG. 16 is explained.

In the modification of FIG. 16, ring shape common wiring 3p and all its inner areas were removed at an etch back of Step S11 of FIG. 15. This separated common wiring 3p, and first plating line 3r and fourth plating line 3u connected with this. That is, as a region of an etch back, as shown in FIG. 13, the circumference of common wiring 3p may be etched into ring shape, and cutting separation of common wiring 3p, and first plating line 3r and fourth plating line 3u connected with this may be done. As shown in the modification of FIG. 16, ring shape common wiring 3p and all its inner areas may be etched, and common wiring 3p, and first plating line 3r and fourth plating line 3u connected with this may be separated.

However, it is more desirable to leave dummy pattern 3w inside common wiring 3p. That is, as shown in FIG. 13, a warp of a substrate can be reduced by etching the circumference of common wiring 3p only into ring shape, and leaving a plurality of dummy patterns 3w as they are.

Next, the assembly of BGA 7 of this embodiment is explained.

First, package substrate 3 formed by separating common wiring 3p and plating line 3q (first plating line 3r and fourth plating line 3u) after supplying electric power via common wiring 3p and plating line 3q in device region 3v of package substrate 3 and forming plating in each wiring and electrode is prepared. That is, the multi-piece substrate (package substrate 3) where the wiring pattern shown in FIG. 13 was formed in device region 3v at the side of main surface 3a, and the wiring pattern shown in FIG. 10 was formed on the other hand in device region 3v at the side of back surface 3b is prepared. The multi-piece substrate where first through hole part 3e pulled out by lead-out wiring 3h from land part 3d and the second through hole part 3g (pad-on via hole) arranged on land part 3d as shown in FIG. 2 are loaded together in each device region is prepared.

Then, die bonding is performed, and as shown in FIG. 17 and FIG. 18, semiconductor chip 1 is adhered via adhesives 2 on main surface 3a of package substrate 3. In the case, semiconductor chip 1 is mounted and adhered on main surface 3a of package substrate 3 so that recess 3x formed by etching (etch back) of the substrate manufacturing process may be covered. FIG. 18 constitutes a drawing penetrating semiconductor chip 1 and also showing the wiring pattern of the chip lower part.

Then, wire bonding is performed. Here, as shown in FIG. 19, pad 1c of main surface 1a of semiconductor chip 1 and bonding lead 3j of package substrate 3 corresponding to this are electrically connected with electrically conductive wires 4, such as a gold wire.

Then, resin molding is performed. Here, the resin seal is done covering a plurality of semiconductor chips 1 and a plurality of wires 4 collectively on main surface 3a of package substrate 3. Hereby, as shown in FIG. 20, semiconductor chip 1 and a plurality of wires 4 are covered with resin body 6. Resin for sealing is thermosetting epoxy system resin etc., for example.

Then, as shown in FIG. 21, ball mounting is performed and solder ball 8 which is an external terminal is connected to each land part 3d of back surface 3b of package substrate 3.

Then, individual separation is performed. For example, it is cut by dicing and individually separated to each BGA 7. Since plating line 10 which is straddling the borderline of the periphery of device region 3v is cut by individual separation in the borderline, it does not project outside from package substrate 3 after cutting (after individual separation).

According to the manufacturing method of BGA (semiconductor device) 7 of this embodiment, by using package substrate 3 in which ring shape common wiring 3p for electric supply was formed in the inner area of bonding lead 3j in device region 3v of main surface 3a, since the main surface 3a side has a space compared with the back surface 3b side covered with a plurality of land parts 3d, a plurality of plating lines 3q for electric supply (first plating line 3r and fourth plating line 3u) connected to common wiring 3p can be drawn around. Therefore, it becomes possible to arrange the feeder for electrolysis plating to all the land parts 3d at the side of back surface 3b via a via hole part (first through hole part 3e or second through hole part 3g).

That is, since the main surface 3a side is only bonding lead 3j of two-row arrangement, there is a space to some extent. Since a space is especially in a corner part, by arranging fourth plating line 3u which connects to common wiring 3p, and is extending and existing to the end portion of a substrate to the corner part, also when supplying electric power from the outside to common wiring 3p, it is possible to carry out via this fourth plating line 3u.

As a result, it becomes possible to perform electrolysis plating to a wiring and an electrode of main surface 3a and back surface 3b of package substrate 3. Also in the semiconductor device with which the perimeter of back surface 3b was covered with the land part 3d of plural lines, electrolysis plating can be performed to all the land parts 3d.

As a result, it becomes possible to perform electrolysis plating to a wiring and an electrode, aiming at the increasing of pin count of a semiconductor device (BGA 7).

It becomes possible to perform wiring and electrolysis plating, aiming at the miniaturization of a semiconductor device (BGA 7), since electrolysis plating can be performed to all the land parts 3d even if the land part 3d of plural lines is arranged with the narrow pitch.

Further, it is package substrate 3 in which common wiring 3p was formed in main surface 3a, etching (etching back) was performed to the circumference of common wiring 3p after performing electrolysis plating, and cutting separation of common wiring 3p, and first plating line 3r and fourth plating line 3u which are connected with this was done. Recess 3x formed by the etch back can be covered by semiconductor chip 1 mounting by this, and semiconductor chip 1 can be further covered with resin for sealing (resin body 6).

Hereby, it can be prevented that the end portion of a wiring is exposed by cutting of a lead-out wiring for electric supply. The generation of the moisture absorption from recess 3x which was formed by etching back of the circumference of common wiring 3p, or the electric short generation by adhesion of conductive foreign matter can be prevented.

In the foregoing, the present invention accomplished by the present inventors is concretely explained based on above embodiments, but the present invention is not limited by the above embodiments, but variations and modifications may be made, of course, in various ways in the limit that does not deviate from the gist of the invention.

For example, although the embodiment explained the case where an external terminal was solder ball 8, external terminals may be cases other than solder ball 8. That is, as long as it is a multi pin semiconductor device assembled using the wiring substrate which was manufactured performing electrolysis plating formation by electric supply through common wiring 3p, they may be semiconductor devices, such as LGA (Land Grid Array). The numbers of arrangement of an external terminal may be plural lines other than five row in the case.

The present invention is suitable for the manufacturing technology of the electronic device which has a wiring substrate.

What is claimed is:

1. A method of manufacturing a semiconductor device, comprising the steps of:
   (a) providing a wiring substrate having an upper surface, a plurality of bonding electrodes formed on the upper surface, a lower surface opposite to the upper surface, a plurality of land portions formed on the lower surface, a plurality of holes formed between the upper surface and the lower surface, a plurality of hole wirings formed inside of the holes, respectively, a common wiring formed inside of the holes in a plan view, a plurality of first lead-out wirings connected with the hole wirings, respectively, and extending from each of the hole wirings toward the common wiring, and a plating layer formed on each of the bonding electrodes;
   (b) after the step (a), mounting a semiconductor chip, having a plurality of pads, over the upper surface of the wiring substrate;
   (c) after the step (b), electrically connecting the pads of the semiconductor chip with the bonding electrodes of the wiring substrate via a plurality of conductive materials, respectively; and
   (d) after the step (c), sealing the semiconductor chip with resin,
   wherein after providing the plating layer, and before the step (b), each of the first lead-out wirings is electrically separated from the common wiring.

2. The method according to claim 1, wherein the common wiring in the plan view is formed in a ring;
   wherein the wiring substrate in the plan view is comprised of a quadrangle; and
   wherein the holes are arranged along each side of the wiring substrate in the plan view.

3. The method according to claim 2, wherein a plurality of dummy patterns are formed inside of the common wiring in the plan view.

4. The method according to claim 1, wherein a plurality of dummy patterns are formed inside of the holes in the plan view.

5. The method according to claim 4, wherein the dummy patterns are formed on both the upper surface and the lower surface.

6. The method according to claim 1, wherein a second lead-out wiring is extended from a peripheral portion of the wiring substrate toward the common wiring; and
   wherein each second lead-out wiring is electrically separated from the common wiring after forming the plating layer, and before the step (b).

* * * * *